(12) United States Patent
Roach et al.

(10) Patent No.: US 6,274,978 B1
(45) Date of Patent: Aug. 14, 2001

(54) FIBER-BASED FLAT PANEL DISPLAY

(75) Inventors: William Ronald Roach, Rocky Hill; Bawa Singh, Voorhees; Satyam Choudary Cherukuri, Princeton; Zilan Shen, West Windsor, all of NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/418,454

(22) Filed: Oct. 15, 1999

Related U.S. Application Data

(60) Provisional application No. 60/121,258, filed on Feb. 23, 1999, provisional application No. 60/137,378, filed on Jun. 3, 1999, and provisional application No. 60/137,380, filed on Jun. 3, 1999.

(51) Int. Cl.$^7$ ........................................... H01J 1/62
(52) U.S. Cl. .................. 313/483; 313/500; 313/498; 313/503
(58) Field of Search .................... 313/483, 500, 313/511, 498, 512, 358; 315/84.6, 169 R

*Primary Examiner*—Vip Patel
*Assistant Examiner*—Ken A Berck
(74) *Attorney, Agent, or Firm*—William J. Burke

(57) ABSTRACT

A display as for images and/or information comprises a plurality of light-emitting fibers disposed in side-by-side arrangement to define a viewing surface. Each light-emitting fiber includes a plurality of light-emitting elements disposed along its length, each having two electrodes between which are applied electrical signals to cause the light-emitting element to emit light to display a pixel or sub-pixel of the image and/or information. The light-emitting fiber includes an electrical conductor disposed along its length to serve as a first electrode, a layer of light-emissive material disposed thereon, and a plurality of electrical contacts disposed on the light-emissive material to serve as the second electrodes of the light-emitting elements. Preferably, the conductors, light-emissive layer and plurality of electrical contacts are formed in a continuous process wherein a transparent fiber passes through a plurality of processing chambers for receiving the electrical conductor, the light-emissive layer and the plurality of electrical contacts thereon.

26 Claims, 17 Drawing Sheets

FIBER-BASED FLAT PANEL DISPLAY

This Application claims the benefit of U.S. Provisional Application Ser. No. 60/121,258 filed Feb. 23, 1999, of U.S. Provisional Application Ser. No. 60/137,378 filed Jun. 3, 1999, and of U.S. Provisional Application Ser. No. 60/137,380 filed Jun. 3, 1999.

The present invention relates to a display and, in particular, to a panel display including plural light-emitting fibers.

The desire for large-size display screens has exceeded the limits of conventional cathode ray tube (CRT) technology in which both the weight and depth of a display tube become excessive when the diagonal of the screen size exceeds about 90 to 100 cm (about 36 to 40 inches). Although rear projection and front projection displays have, at least temporarily, filled a need for larger screen displays in the range of about 90 to 150 cm (about 36 to 60 inches) diagonal, however, such projection displays are also quite deep to accommodate the projection optics, behind the screen in a rear projection display and in the projector in a front projection display, and also have difficulty in achieving and maintaining optical alignment and image registration.

Moreover, as other technologies such as plasma displays and active matrix liquid crystal displays (AMLCD) have been considered for application to large size screen displays that are relatively thin, production yield and cost have become a significant problem. This problem arises from the fact that as the diagonal dimension of the display screen increases, the number of picture elements or pixels in the display increases as the square of the dimension increase, i.e. in relation to the area, and so increases the probability of any display having a defective pixel. Thus a 20% increase in screen diagonal results in about a 44% increase in the screen area and thus in the number of pixel elements and, disregarding the increased difficulty of manufacturing a larger structure, the likelihood of a defective pixel also increases by about 44%. For example, a process having a 90% yield in producing 50 cm (about 20 inch) diagonal displays would have about a 40% yield for 125-cm (about-50 inch) diagonal displays, and about a 10% yield for 150-cm (about 60-inch) diagonal displays.

Displays with defective pixels are generally not repairable and so must be discarded—any one visible defect can be enough to cause the entire display panel to be scrapped, and the defect can only be found after the expensive panel processing is completed, thereby creating expensive waste. In addition, the capital cost of processing facilities capable of producing such large-area displays is very high, as is the per unit processing cost owing to the need for precision processing, such as lithography, for example. These are major disadvantages of these technologies.

A further disadvantage of the foregoing conventional technologies is that each display device size and configuration must be specifically designed and must be specially tooled for manufacture, both of which require substantial time and resources to accomplish. It would be desirable to avoid such specialized designs.

In addition, where the display screen size is greater than that which can be realized with a single structure in a conventional display technology, as is the case, for example, with wall-size displays, very-large screen television displays, billboards, scoreboards, highway and other signs and the like, it becomes necessary to array (or "tile") a number of display sections side-by-side to together form a larger display screen, thereby introducing seams between the tiled sections that produce objectionable lines or distortions in the displayed composite image.

Accordingly, there is a need for a display device that is suitable for large-size displays and that is not excessively deep or heavy. It would also be desirable that such display not require tiling to form large display screens and that the defect rate not increase as the square of a screen dimension increase.

To this end, the display of the present invention comprises a plurality of fibers disposed in side-by-side arrangement to define a viewing surface of the display, a plurality of light-emitting elements disposed along a surface of each of the plurality of fibers opposite the viewing surface of the display, each light-emitting element having at least a first electrode at which an electrical signal is applied to cause the light-emitting element to emit light, and a plurality of at least first electrical conductors coupled to the first electrodes of the plurality of light-emitting elements to apply at least first electrical signals representative of information to be displayed thereto, thereby causing the light-emitting elements to emit light to display information on the viewing surface.

BRIEF DESCRIPTION OF THE DRAWING

The detailed description of the preferred embodiments of the present invention will be more easily and better understood when read in conjunction with the Figures of the Drawing which include.

DESCRIPTION OF THE PREFERRED EMBODIMENTS

Figure 1A:
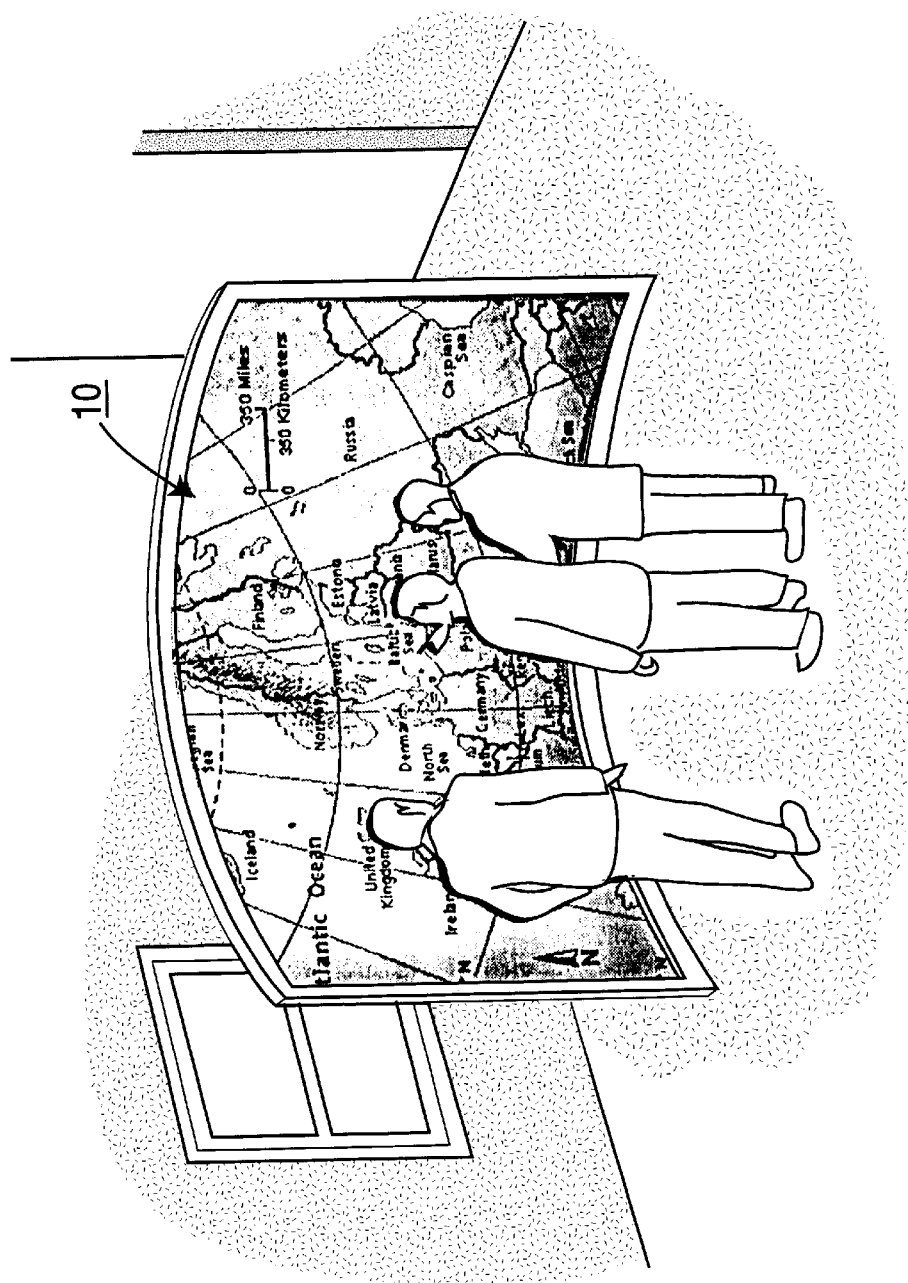
FIGS. 1A and 1B are diagrams illustrating a large-area flat panel display.

FIG. 1A illustrates an exemplary large-area flat panel display 10 on which an image or information is displayed.

Figure 1B:
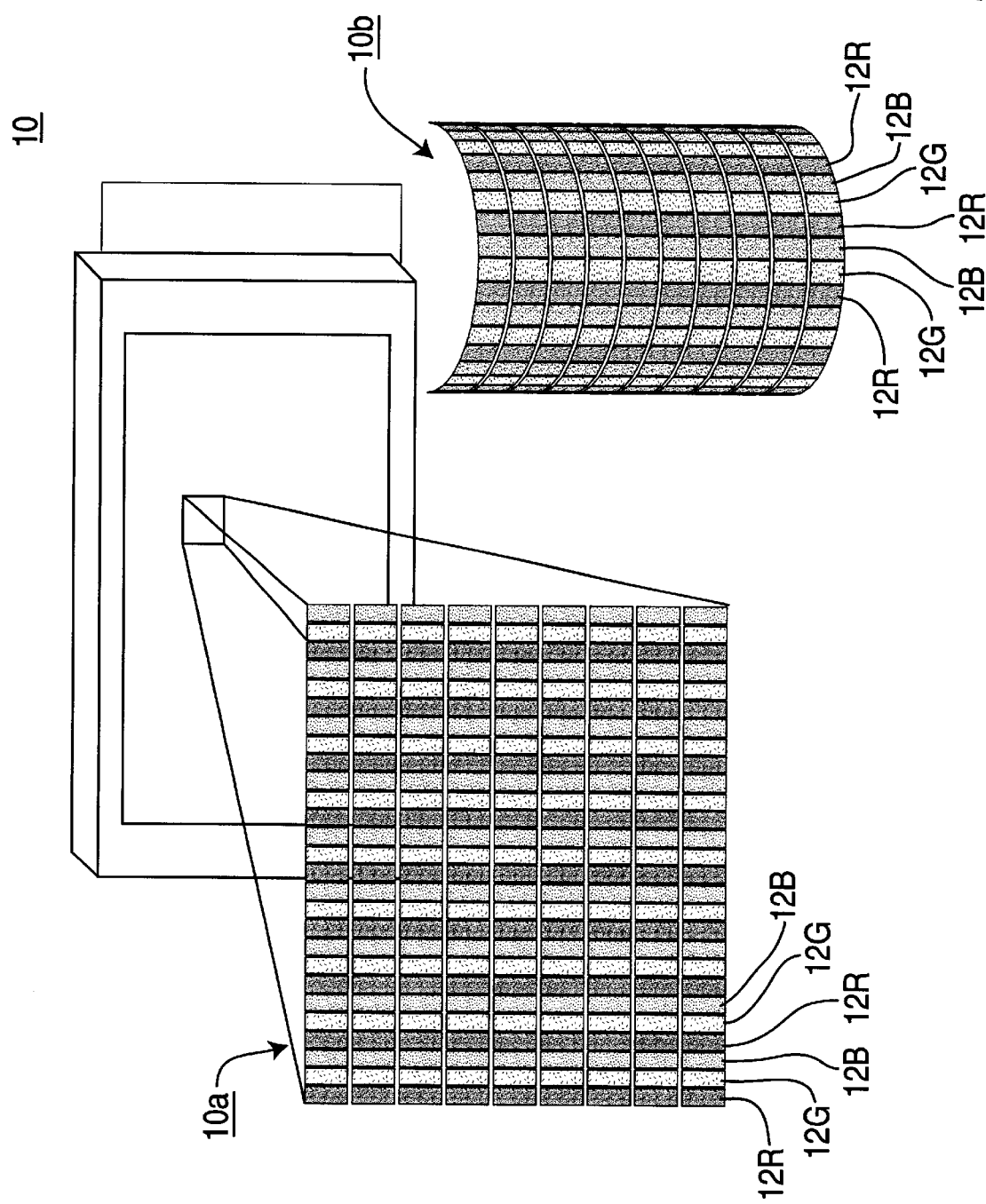

As used herein, image and/or information are used interchangeably with respect to what is displayed on a display device, and are intended to encompass any and all of the wide variety of displays that a user may desire, including, but not limited to, visual images and pictures, whether still or moving, whether generated by a camera, computer or any other source, whether true, representative or abstract or arbitrary, whether or not including symbols or characters such as alphanumeric characters or mathematical notations, whether displayed in black and white, monochrome, polychrome or full color. Large-area display 10 is preferably for direct viewing of information and, as illustrated in FIG. 1B, display 10 is thin and may be a flat, i.e. planar, display 10*a*, or may be a curved, cylindrical (as illustrated) or otherwise non-planar display 10*b*. Displays 10, 10*a*, 10*b* display color images and/or information by activating groups of contiguous pixels providing image information in three respective colors formed, for example, of a repeating sequence of red- (R), green- (G) and blue- (B) colored-light-emitting stripes 12R, 12G, 12B, similar to the colored phosphor stripes as in a conventional television CRT.

Figure 2:
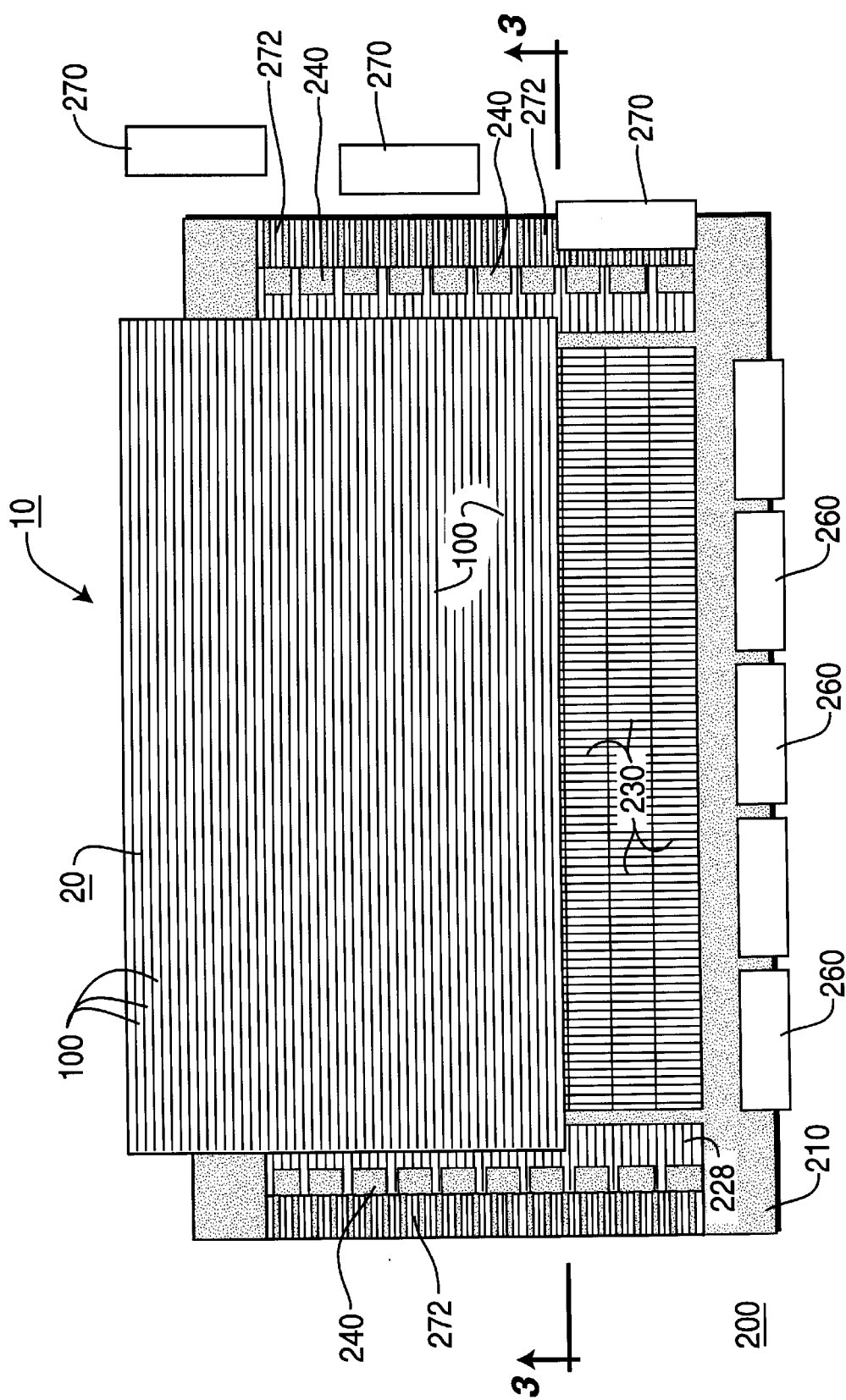
FIG. 2 is a plan view, partially cut away, of an exemplary embodiment of a display in accordance with the present invention.
Figure 3:
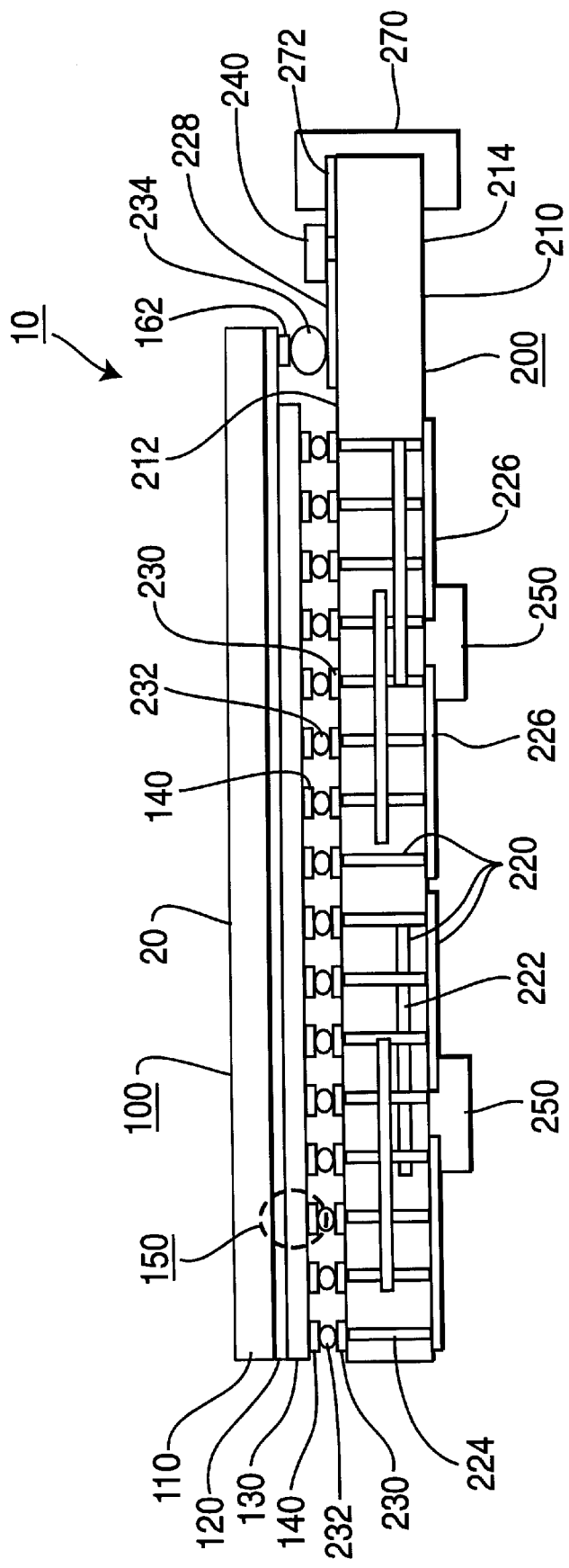
FIG. 3 is a side cross-sectional view of the exemplary embodiment of the display of FIG. 2.

FIG. 2 shows a front plan view of an exemplary embodiment of a display 10 in accordance with the present invention and FIG. 3 shows a side cross-sectional view thereof. Display 10 includes a plurality of light-emitting fibers 100 arranged horizontally in a side-by-side arrangement, in particular, in a substantially parallel side-by-side arrangement, extending substantially the full dimension of display 10 to define the "screen" or viewing surface 20 of display 10. As will be described in detail below, each of light-emitting fibers 100 has a plurality of light-emitting elements 150 (described below) disposed along the length of a light-transmissive transparent fiber or ribbon ("fiber") 110 to form a linear array of light-emitting elements 150. When placed side-by-side, a plurality of such light-emitting fibers 100 form a two-dimensional array of light-emitting elements 150. If such array has a number N of such fibers 100, and each fiber 100 has a number M of light-emitting elements 150 thereon, then an M×N element display 10 is formed, as seen at viewing surface 20.

In a color display 10 for displaying a color image, the light-emitting fibers 100 are arranged side-by-side in a repeating sequence of single-color fibers 100 that emit red (R), green(G) and blue (B) color light, respectively, so that each group of adjacent R, G, B pixels on adjacent R, G and B fibers 100 provides a color pixel, and the display 10 displays a color image. Other colors, such as yellow, magenta and cyan, may also be employed. As is described in greater detail below in relation to FIG. 6, light emission from fibers 100 is preferably from an organic light-emitting diode (OLED) material positioned between a transparent conductive electrode 120 on one face or surface of a transparent fiber 110 and a plurality of metal contacts 140 that define the pixel geometry of light-emitting fiber 100. Light emitted from light-emitting fibers 100 exits the OLED pixel by passing through transparent electrode 120 and transparent fiber 110.

The light-emitting fibers 100 are mounted to and electrically connected to interconnection structure assembly 200 of display 10 as described in detail below. Structure 200 includes a generally planar circuit substrate 210 which preferably is formed of a plurality of alternating layers of insulating material and patterned electrical conductors 220. Substrate 210 includes a plurality of patterned electrical conductors 220 for interconnecting the various elements of structure assembly 200 and the electronic devices 240, 250 mounted thereon to the panel of light-emitting fibers 100.

Specifically, contacts 140 to the respective second electrodes of the light-emitting elements 150 of fibers 100 are connected to corresponding data line segment conductors 230 on the top 212 of substrate 210 by conductive bumps 232 which may be of solder or electrically conductive frit or adhesive. Similarly, first electrodes 120 of the light-emitting elements of fibers 100 are connected to corresponding select line conductors 228 by conductive bumps 234. Preferably, a light-emitting element 150 is positioned at each intersection of each fiber 100 and a data line segment 230.

Also mounted to substrate 210 are electronic devices 240, 250 for providing the electrical signals that are applied to the respective electrodes of the light-emitting elements 150 on fibers 100 to cause an image or information to be displayed on the viewing surface 20 of display 10. Select line driver circuits 240 are electronic devices, preferably mounted to the top surface 212 of substrate 210, that receive electrical signals representative of an image or information to be displayed on display 10 and, in response thereto, generate picture element selection signals that are applied to the first electrodes of the appropriate light-emitting elements 150 of fibers 100 via select line conductors 228, conductive bumps 234 and conductors 120. In the exemplary embodiment of FIGS. 2 and 3, select line drivers 240 provide row drive signals to a row of pixels 150 along light-emitting fibers 100.

Similarly, data line driver circuits 250 are electronic devices, preferably mounted to the bottom surface 214 of substrate 210, that receive electrical signals representative of an image or information to be displayed on display 10 and, in response thereto, generate picture element data signals that are applied to the appropriate second electrodes of light-emitting elements 150 of fibers 100 via data line conductors 226, various ones of conductors 220, data line segments 230, conductive bumps 232 and first electrode contacts 140 of light-emitting elements 150 of fibers 100. In the exemplary embodiment of FIGS. 2 and 3, data line drivers 240 provide column drive signals to a vertical column of corresponding pixels 150, one on each of the adjacent light-emitting fibers 100.

Conductors 220 of substrate 210 include internal conductors 222 generally parallel to the broad surfaces of substrate 210, conductors 226, 228, 230 on the broad surfaces 212, 214 thereof, and conductors 224 that run transverse thereto for providing electrical connections between and to conductors 226, 228, 230 on the surfaces 212, 214 of and conductors 222 on internal layers of substrate 210. As is convenient, electrical signals representative of the image or information to b e displayed is connected to substrate 210 through edge connectors 260 and 270 which make electrical contact with corresponding contacts 262 and 272 on substrate 210, which contacts 262 and 272 connect respectively to the select line driver circuits 240 and to the data line driver circuits 250, respectively. It is noted that in FIG. 2, a number of fibers 100 near the lower edge of display 10 are not shown so as to make visible the data line segment conductors 230 on substrate 210, and that some edge connectors 260, 270 are shown separated from substrate 210 or are not shown.

The side-by-side array of light-emitting fibers 100 of display 10 may advantageously be employed to fashion a display 10 of virtually any desired size or aspect ratio. All of the fibers 100 are preferably of the same type and may be cut to any desired length, and so the fiber 100 itself is not limiting as to the size or shape of the display. The height of the display 10 (i.e. distance from top to bottom in the display orientation of FIG. 2) may easily be changed by simply changing the number of the light-emitting fibers 100 that are arrayed side-by-side. The width of display 10 (i.e. from side to side in the orientation of FIG. 2) may easily be changed by simply changing the length of the light-emitting fibers 100 in the side-by-side array, for example, by simply cutting the fibers 100 to a desired length.

In addition, another advantage of the present arrangement is that the select line driver circuits 240 and the data line driver circuits 250 may be tested before attachment to substrate 210, which may itself be tested before assembly of drive circuits 240, 250 thereto, thereby substantially reducing the likelihood of fabricating a defective interconnection structure 200 that would need repair. Further, employing edge connectors 260, 270 along various ones of the edges of interconnection structure 200 facilitates ease of assembly of display 10 into a final product and, in the unusual event that service or repair become necessary, disassembly therefrom.

Figure 4:
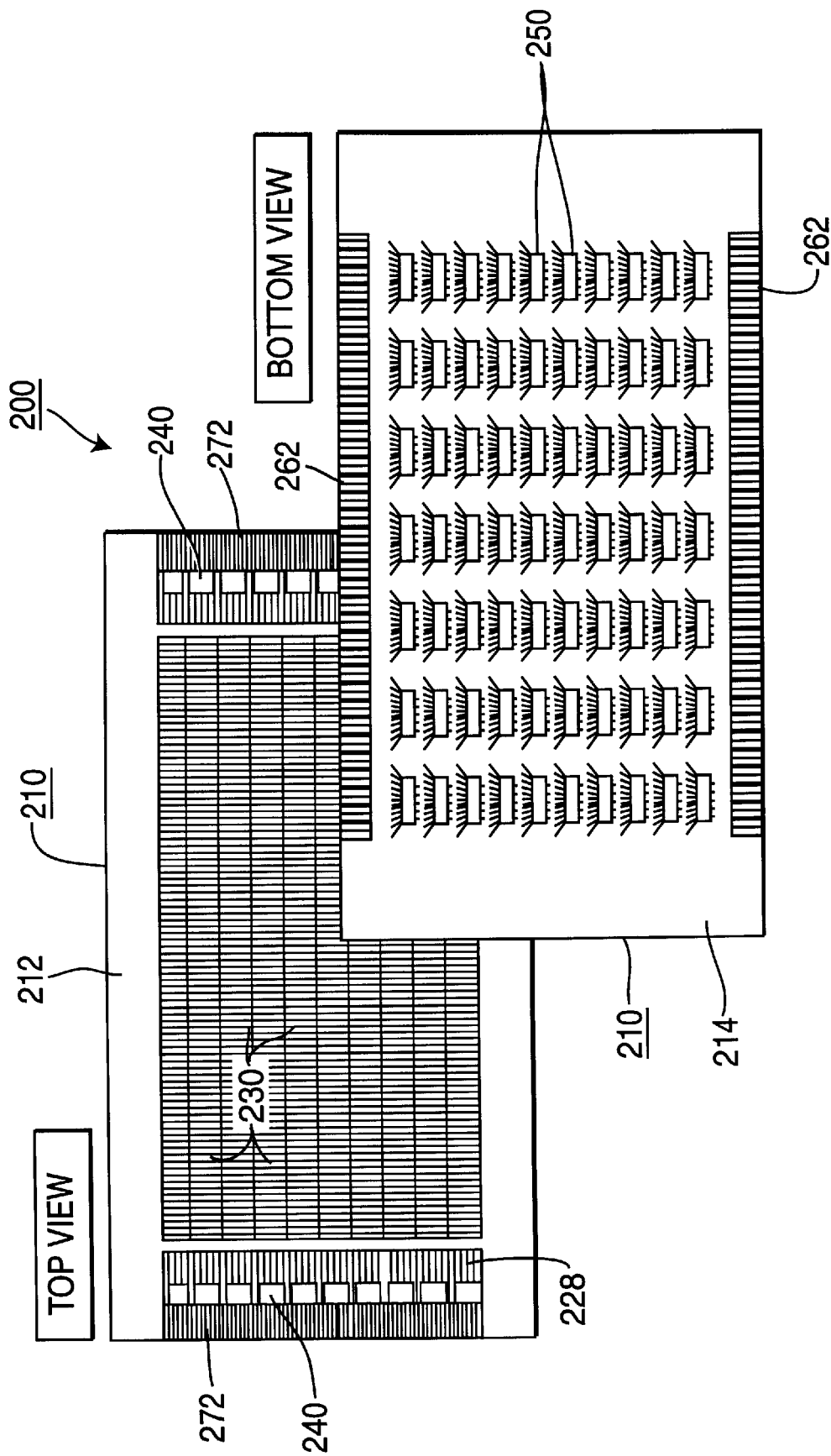
FIG. 4 is a plan view showing the top and bottom sides of an exemplary interconnection circuit board useful in the display of FIG. 2.

FIG. 4 shows top and bottom views of an exemplary interconnection structure assembly 200 including circuit substrate 210 useful in the display 10 of FIG. 2, and illustrates the repetitive nature of the arrangement of the patterns of conductors of structure 200 that facilitates changing the size and/or aspect ratio of display 10 without the expenditure of substantial time or resources. On front or top surface 212 of substrate 210, for example, is a pattern of data line segment conductors 230. Each data line segment conductor 230 is arranged vertically for contacting one light-emitting element 150 on each of a number of adjacent horizontal fibers 100, for example, a subset of 32 adjacent fibers, wherein the light-emitting element 150 on each fiber is in a like position with respect to the short edges of substrate 210.

Mounted on the bottom or back surface 214 of substrate 210 is an array of data line driver circuits 250, preferably electronic integrated circuits, that are connected by conductors 220 (not visible) to data line segment conductors 230 for applying thereto electrical signals representative of information to be displayed. Preferably, each data line driver circuit 250 is connected to a number of adjacent data line segment conductors 230 in one horizontal row. Each data line driver circuit 250 receives via conductors 220 (not visible) electrical signals representative of information to be displayed, which signals are received at edge contacts 262 preferably located along the opposing long edges on the bottom surface of substrate 210.

Mounted on the front or top surface 214 of substrate 210 is an array of select line driver circuits 240, preferably electronic integrated circuits, that are connected to select line conductors 228 for connecting to light-emitting fibers 100 for applying thereto electrical signals representative of information to be displayed. Preferably, each select line driver circuit 240 is connected to a number of adjacent select line fiber conductors 228. Each select line driver circuit 240 receives via conductors 272 electrical signals representative of information to be displayed, which signals are received at the edge contacts 272 preferably located along the opposing short edges on the top side of substrate 210. It is noted that light-emitting fibers 100 may be driven by one select line driver circuit 240 disposed at one end thereof or fiber 100 may be driven from both ends by two select line driver circuits 240 disposed at the opposite ends of fiber 100.

Any convenient number of select line conductors 226 may be driven by each select line driver circuit 240 and be placed side-by-side to obtain the desired height of display 10. Similarly, any convenient number of data line segment conductors 230 may be placed side-by-side to obtain the desired width of display 10, and any convenient number of rows of fibers 100 can be connected to each vertical data line segment conductor 230 to obtain the desired height of display 10. In general, it is convenient for the number of data line segments and of select line segments to be $2^n$ so that efficient use is made of the digital signal bits that address such lines. With respect to the number of light-emitting fibers 100 that are driven by each select line driver circuit 240, however, the fact that subsets of three adjacent fibers (one each of red, green and blue emitting type) provide subsets of three adjacent sub-pixels that together form one color pixel should be considered in addition to the efficient use of digital signal capacity. It is presently preferred that each of select line driver circuits 240 drive up to $2^5=32$ pixels 150, and so groups of 30 fibers are driven by each select line driver circuit 240, although greater numbers of fibers could be so driven, e.g., 240 out of $2^8=256$ pixels. It is presently preferred that each data line driver circuit 250 drive $2^5=32$ data line segments 230, however, many more data lines could be so driven, and that each data line segment 230 connect to the same number of fibers 100 as are driven by each select line drive circuit 240, e.g., 30 fibers 100.

Thus it is evident that the repetitiveness of the data line driver circuits 250 and of the select line driver circuits 240, and the arrangement thereof and the conductors 220 connecting thereto, define cells that are arranged in rows and columns. This repetitive cell arrangement facilitates direct multiplex addressing of individual pixels. It also facilitates easy expansion or contraction of interconnection structure 200 and substrate 210 in either the horizontal or vertical dimension, by simply adding or removing rows or columns of such cells, quickly and without substantial expense. Moreover, the arrangement describes lends itself to the direct multiplex addressing of display picture elements via edge contacts 262, 272, without the added complexity and cost associated with other addressing schemes. In any event, with the plentiful and inexpensive integrated circuits available for processing image data, such as the 450 MHZ–500 MHZ Pentium® and other micro-processors now available, formatting and reformatting image data for a particular display, such as to reorient the fibers 100 from a horizontal to a vertical orientation, is easily and cheaply accomplished.

Substrate 210 may be formed as a conventional multi-layer printed wiring circuit board or as a multi-layer ceramic substrate, such as a low-temperature co-fired ceramic material structure laminated to a metal base sheet (LTCC-M substrate). An LTCC-M substrate typically has a metal base sheet that provides strength and preferably has a coefficient of thermal expansion that closely matches that of the ceramic layers, for example, a titanium sheet. Ceramic layers of substrate 210 are cut from tapes or sheets of green ceramic material formed from a slurry of ground powdered glasses, such as zinc-magnesium-borosilicate glass and magnesium aluminosilicate glass, inorganic fillers, organic binders, resins, surfactants and solvents. Electrical conductors 220 are typically formed by depositing patterns of conventional electrically-conductive thick-film inks on the ceramic layers before they are laminated together and to the metal sheet and are fired. It is noted that such substrates may be formed in curved and other shapes as may be convenient or desirable for a particular (application prior to firing. Such substrates are described, for example, in application Ser. No. 09/354,516 filed Jul. 15, 1999 entitled "FIELD EMISSION DISPLAY WITH MULTI-LAYER CO-FIRED CERAMIC SUBSTRATE", in U.S. Pat. 6168410 (application Ser. No. 09/088,501 filed Jun. 1, 1998) entitled "BACK PANEL FOR A PLASMA DISPLAY DEVICE", and in U.S. Pat. (application Ser. No. 09/042,076 filed Mar. 13, 1998) entitled "PLASMA DISPLAY DEVICE", which are hereby incorporated by reference herein in their entireties.

Figure 5:
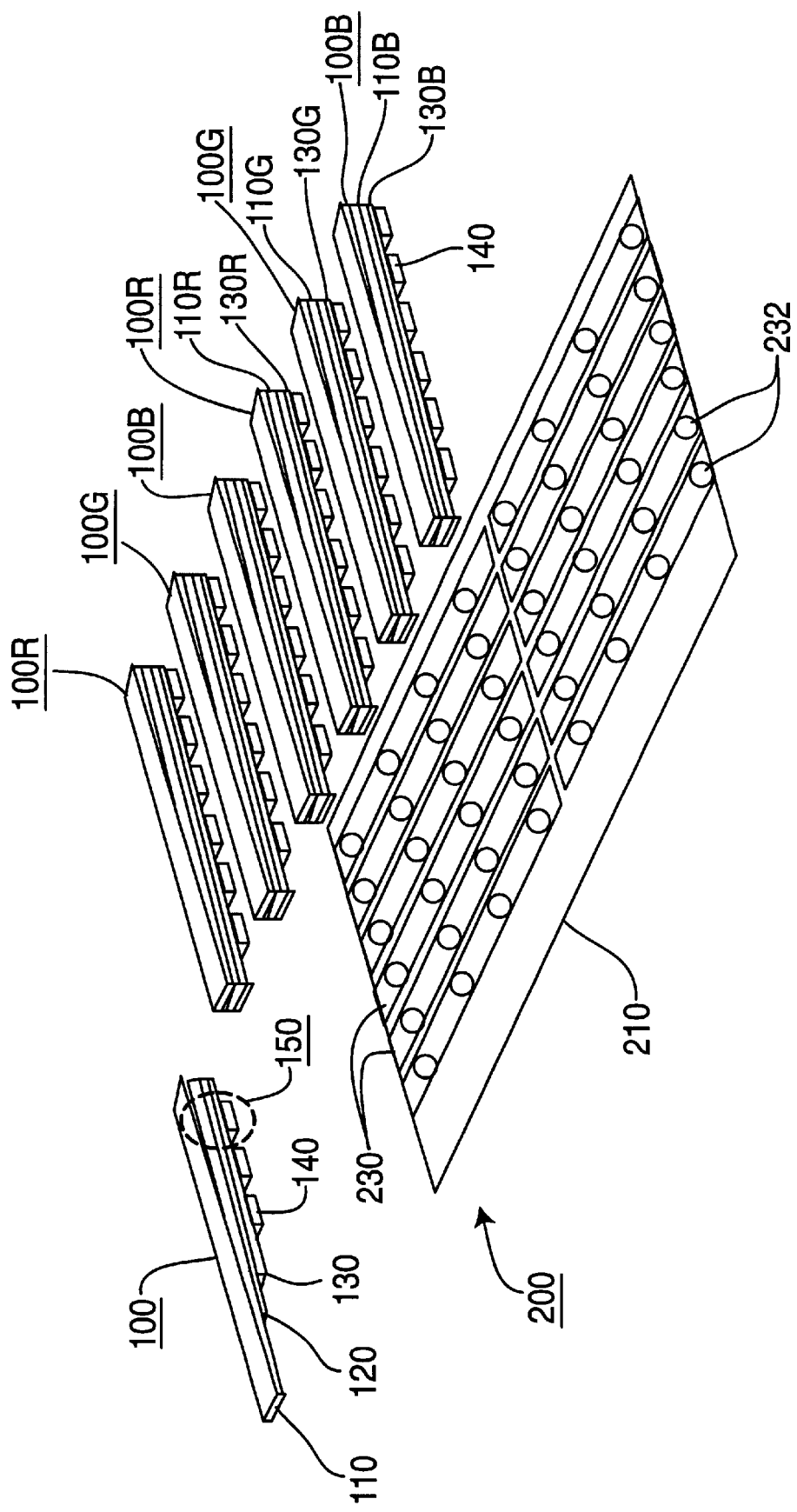
FIG. 5 is an expanded perspective view of a portion of the exemplary display of FIG. 2.

FIG. 5 is an expanded perspective view of a portion of the exemplary display 10 of FIG. 2 illustrating the attaching of light-emitting fibers 100 to substrate 210 in making interconnection structure assembly 200. A plurality of conductive bumps 232, for example, four bumps, are formed on each of data line segment conductors 230 on substrate 210. Preferably, conductive bumps 232 are of an electrically-conductive adhesive, either anisotropic or isotropic, such as those available commercially from Elform Corporation located in Reno, Nev., including type AECT-F adhesive. Light-emitting fibers 100 are elongated and have a plurality of light-emitting devices thereon formed in a light-emissive material, as is described in detail below. Each of the light-emitting devices 150 of fiber 100 has an electrical contact 140 thereon that is available to be connected to along one surface of the light-emitting fiber 100, wherein the pitch (i.e. center-to-center spacing) of the LED contacts 140 is substantially the same as the pitch of the data line segment conductors 226. As a result, light-emitting fibers 100 are positioned over substrate 210 in a direction orthogonal to the long direction of data line segment conductors 230 and are pressed against substrate 210 to complete electrical connections between respective LED contacts 140 and associated data line segment conductors 230 via contact bumps 232.

As should be evident from the foregoing description, the assembly of display 10 includes the progressive assembly of simpler components and elements into more complex sub-assemblies and finally into a display 10. One significant advantage of this arrangement is the ability to test and, if necessary, repair components and elements at each step of the progressive assembly. For example, with respect to interconnection structure 100: substrate 210, select line driver circuits 240 and data line driver circuits 250, can each be tested separately before they are assembled together. Only the lowest complexity non-repairable defective part need be scrapped; all others are repairable. Similarly, each of the light-emitting fibers 100 can be tested before attachment to substrate 210 (which itself can be tested prior to assembly), and so only those fibers, if any, that may be damaged during assembly to substrate 210 to make display 10 need be removed and replaced. A defective display 10 that cannot easily be repaired should rarely, if ever, occur.

Another advantage accrues from the yield characteristics of the fibers. For example, a process that has a yield of 90% for producing 50-cm (about 20-inch) diagonal conventional displays and a yield of only about 40% for a 125-cm (about50inch) diagonal conventional display, would have a yield of about 99.6% for producing a 0.5 mm (0.020 inch) wide by 100-cm (about 40-inches) long fiber 100 from which a 75 cm by 100 cm (about 30 inches by 40 inches) display having about a 125 cm (about 50 inch) diagonal can be made. This advantage of the present invention accrues due to the fact that yield is inversely related to the length of fiber 100, whereas the yield for conventional displays is inversely related to the area of the display, i.e. the square of the diagonal of the display. Further, because the individual fibers are preferably tested before assembly in to a display, even if a substantial number of the relatively inexpensive fibers are defective and are thrown away, the effect thereof on the total cost of the display 10 is relatively minor.

Accordingly, the display according to the present invention avoids the problem of prior art displays that have to be scrapped, at great waste and expense, due to some component or element thereof being defective.

Figure 6:
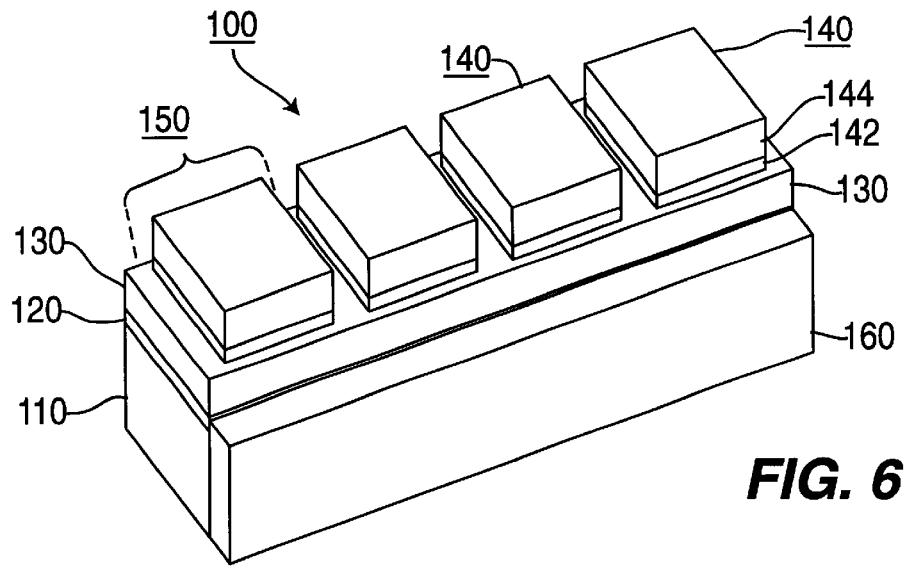
FIG. 6 is a perspective view of a portion of an exemplary embodiment of a light-emitting fiber according to the present invention that is useful in the display of FIG. 2.

FIG. 6 is a perspective view of a portion of an exemplary embodiment of a light-emitting fiber 100 useful in the display of FIG. 2. Light-emitting fiber 100 is made in long lengths containing a linear array of a substantial number, perhaps hundreds or even thousands, of light-emitting elements or pixels 150 on one surface thereof. Each pixel emits light in response to a potential applied between opposing electrodes, 120, 140, one of which 120 is transparent and the other of which 140 is patterned or segmented to define the pixel. The light produced by each light-emitting element 150 passes through the transparent fiber 110 to exit through a viewing surface thereof opposing the surface on which the light-emitting element 150 resides. FIG. 6 shows a short segment of a light-emitting fiber 100 having four light-emitting elements 150 thereon.

Figure 7A:
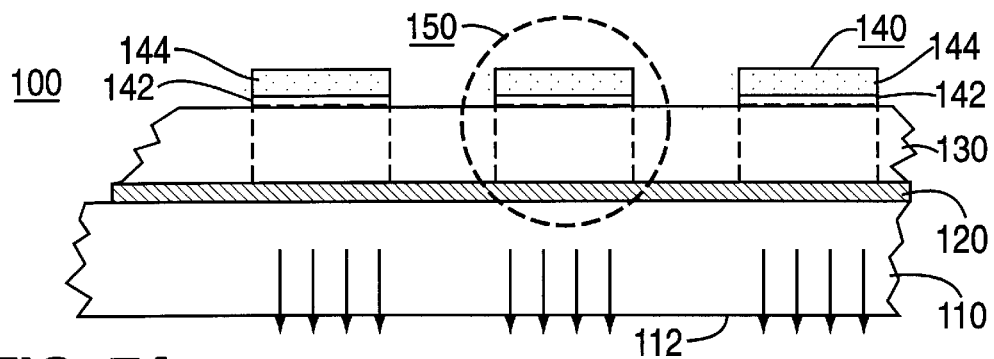
FIGS. 7A and 7B are longitudinal and transverse cross-sectional views of the exemplary fiber of FIG. 6.
Figure 7B:
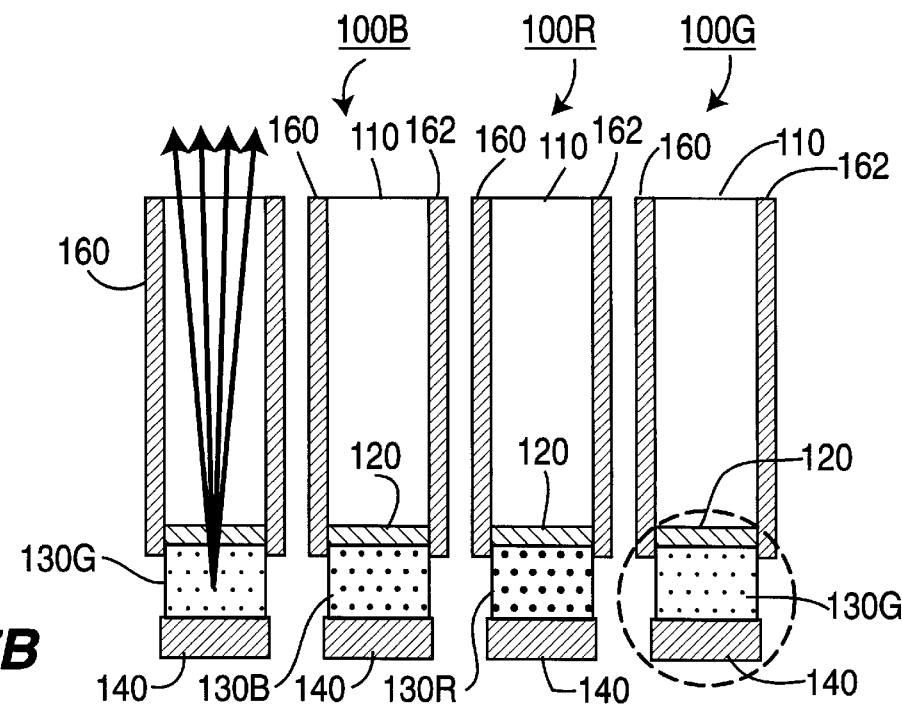

As is best understood by considering FIG. 6 in conjunction with the longitudinal view of FIG. 7A and the transverse cross-sectional view shown in FIG. 7B, the core of light-emitting fiber 100 is a long glass or plastic transparent fiber 110 of convenient cross-sectional shape, such as a square, rectangular, trapezoidal, circular, semicircular or "D" shape, for example. An elongated, optically-transparent conductor 120, such as a thin layer of ITO (indium tin oxide), tin oxide, zinc oxide, organic conducting material or other optically-transparent electrically-conductive material, is formed along one surface of fiber 110, such as by sputtering, to serve as a hole-injecting first electrode or contact for each of the light-emitting elements 150 of light-emitting fiber 100. A layer of light-emissive material 130 is formed over ITO conductor layer 120, such as of an organic light-emitting device (OLED) material or an inorganic electro-luminescent (EL) material. A polymer OLED material, typically having a thickness of about 500 Å, is preferred. Light-emissive material 130 may be deposited as a long continuous strip or may be deposited in a pattern of segmented light-emissive material regions spaced along fiber 100. A pattern of segmented electron-injecting electrodes or contacts 140 is formed on the light-emissive material 130 to provide the second electrical electrode or contact to each of the light-emitting elements 150 on light-emitting fiber 100. It may be desirable to overcoat at least the areas of pixel elements 150 other than contacts 140 with a coating, for example, of silicon nitride, diamond-like carbon or epoxy, silicon carbide, sub-oxides of these materials, oxy-carbides of these materials, or compounds containing any of the foregoing materials and hydrogen resulting from plasma enhanced chemical vapor deposition to reduce moisture absorption and reactive gas permeation by the OLED material.

Specifically, segmented contacts 140 include a plurality of electron-injecting cathode electrodes 142 formed of a cathode material, such as magnesium, magnesium/silver, calcium or calcium/aluminum (or other material containing a low work function metal) having a thickness of about 1000 Å–2000 Å, spaced apart along fiber 100, each one of which corresponds to a light-emitting element 150 of light-emitting fiber 100. Each cathode electrode 142 is coated with a layer of conductive material 144, such as silver, gold or other suitable metal having a thickness of about 1000 Å, as is convenient for subsequent electrical connection to external circuitry. Magnesium/silver electrode 142 and silver contact 144 are preferably evaporated onto OLED layer 130. In operation, data potentials are applied to contacts 140 of light-emitting fibers 100 by data line drive circuits 250 via data line conductor segments 226, 220, 230 and others of conductors 200 to cause the light-emitting elements 150 selected by select line drive circuits 240 applying select potentials via conductors 228, 234 to conductors 120, 160, 162 of light-emitting fiber 100 to produce light responsive to the value of the data potential, the display 10 formed by the many light-emitting elements 150 of light-emitting fibers 100 thereby displaying an image.

Preferably, a metal conductor 160, 162, such as an aluminum, gold, silver, copper, chromium, nickel, or other metal conductor having a thickness of about 10,000 Å to about 100 μm, is formed along one or both of the elongated side surfaces of transparent fiber 110 that are adjacent to the surface thereof on which the ITO conductor 120 is formed. This is desirable because the sputtered ITO layer 120, which is only about 1200 Å thick so as to be suitably transparent, is too resistive to serve as a good conductor along the length of a long light-emitting fiber 100. Conductors 160, 162 are electrically connected to the thin, optically-transparent ITO conductor 120 along a corner of fiber 110 which may be beveled or rounded where ITO layer 120 contacts conductors 160, 162, for providing a low resistance conductor in parallel with ITO layer 120 so as to apply select potential from select line drive circuits 240 (via select line conductors 228) to the first contacts 120 of the light-emitting devices 150 along light-emitting fiber 100 without excessive loss of potential that would otherwise result due to the resistance of the long ITO conductor 120. A further advantage of conductors 160, 162 is that they reflect light produced by OLED 130 thereby reducing light loss through the sides of transparent fiber 110.

It is noted with respect to FIG. 7B that three different fibers 100R, 100G, 100B are illustrated, as is the case for a color display. These fibers are of the same structure, but differ in the light-emitting material, i.e. red-light-emitting fiber 100R has a red-light-emitting OLED material layer 130R, green-light-emitting fiber 100G has a green-light-emitting OLED material layer 130G, and blue-light-emitting fiber 100B a has blue-light-emitting OLED material layer 130B.

Suitable transparent fibers 110 include glass fibers, such as those of borosilicate or soda-lime glass, quartz, sapphire or other suitable glass material, and plastic fibers, such as those of polymethyl-methacrylate (PMMA), polycarbonate, acrylic, Mylar, polyester, polyimide or other suitable plastic material. A square transparent fiber 110 having a width of 0.5 mm and a height of 0.5 mm, or a rectangular transparent fiber 110 having a width of 0.5 mm and a height of 0.75 mm, is convenient, and is flexible, with the LED elements formed on one of the 0.5 mm wide surfaces with each LED element forming a pixel (picture element) of about 0.5 mm by 1.5 mm. The three-to-one aspect ratio of each pixel 150 and the relatively large pixel size make the light-emitting fibers 100 easy to align into a display 10.

The above description of FIG. 6, FIG. 7A and FIG. 7B indicate that the fiber 110 is transparent and has light-emitting elements 150 on one surface and a transparent electrode 120 positioned to be in contact with the fiber 110 and the light-emitting layer 130 and an opposing opaque electrode 140 positioned on top of the light-emitting layer 130. However, an alternative arrangement of fiber 100 that is also useful employs an opaque fiber 110, where electrode 120 is in contact with the light-emitting fiber 130 and the electrode 140 on top of the light-emitting material 130 is transparent. In this case the light would be emitted through the top electrode 140 so that the fiber 110 need not be transparent and could be made of an opaque material such as a metal.

In a color display 10, in particular, three adjacent light-emitting fibers 100 each contribute a 0.5 mm by 1.5 mm monochrome pixel of a different color that together provide a 1.5 mm by 1.5 mm color pixel (e.g., a display 10 has light-emitting fibers 100 arranged side-by-side in a repeating sequence of single-color fibers 100 emitting red (R), green (G) and blue (B) color light, respectively, so that each group of adjacent R, G, B pixels provides a color pixel). Fibers 100 that emit one particular color may be provided in various ways. As illustrated in FIG. 5, for example, three different types of light-emitting fibers 100R, 100G, 100B may be fabricated employing the same broadband (i.e. multi-color) light-emitting material 130 on respective colored transparent fibers 110R, 110G, 110B that are tinted each to one of the three desired colors R, G, B, thereby to provide light-emitting fibers 100R, 100G, 100B emitting the three colors R, G and B, respectively. Alternatively, three different narrowband (i.e. single color) light-emitting materials 130R, 130G, 130B that respectively emit one of the desired three colors R, G and B may be deposited on respective transparent fibers 110, thereby to provide light-emitting fibers 100R, 100G, 100B emitting the three colors R, G and B, respectively. Further, respective light-emitting materials 130R, 130G, 130B that emit one of the three colors R, G, B may be deposited on respective correspondingly tinted transparent fibers 110R, 110G, 110B to provide R, G and B light-emitting fibers 100R, 100G, 100B, respectively. The use of tinted transparent fibers 110 advantageously reduces the reflection of ambient light by the OLED materials, thereby tending to improve the contrast ratio of display 10'.

Where a monochrome display 10, 10' is desired, the desired color may be obtained by employing a transparent fiber 110 tinted to the desired color, a light-emitting material 130 emitting light of the desired color, or both. A clear transparent fiber 110 may also be employed with a broadband light-emitting material 130 that emits light that appears "white" or close to white.

Suitable small molecule OLED structures are known and include ITO as the hole injector, green-emitting OLED fabricated from naththyl-substituted benzidine derivative (NPB) as the hole transport layer, tris-(8-hydroxyquinoline) aluminum ($Alq_3$) as the electron transport layer, and magnesium/silver as the cathode, which are available commercially from Aldrich Chemical Company located in Milwaukee, Wisconsin and are reported by E. W. Forsythe et al in Extended Abstracts of The Fourth International Conference on the Science and Technology of Display Phosphors & 9th International Workshop on Inorganic and Organic Electroluminescence, Sept. 14–17, 1998, at page 53.

Red emission is obtained by doping the $Alq_3$ layer in the foregoing OLED structure doped with 6% 2,3,7,8,12,13,17,18-octaethyl-21H,23H-porphine platinum (II) (PtOEP) as reported by D. F. O'Brien et al in the Extended Abstracts of The Fourth International Conference on the Science and Technology of Display Phosphors & 9th International Workshop on Inorganic and Organic Electroluminescence, Sept. 14–17, 1998, at page 37 et seq. Blue emission is obtained in the foregoing OLED structure by including an additional layer. This OLED structure includes spiro-linked TAD (spiro-TAD) as the hole transport layer, spiro-linked sexiphenyl (spiro-6Φ) as the blue emitter layer, and $Alq_3$ as the electron transport layer as reported by Frank Weissortel et al in Extended Abstracts of The Fourth International Conference on the Science and Technology of Display Phosphors & 9th International Workshop on Inorganic and Organic Electroluminescence, Sept. 14–17, 1998, at page 5 et seq.

Small-molecule OLED materials may be applied by evaporation and polymer OLED materials may be deposited as monomers, for example, using ink jet printing, roller coating, screen printing and the like to deposit mixtures of the OLED material and suitable solvents as is known, and subsequently evaporating the solvent(s) and polymerizing the monomer by heating.

For a polymer OLED structure, ITO may be employed as the hole injector layer and poly(ethylene dioxythipene, commonly known as PEDOT, doped with polystyrene sulfonic acid (PEDOT:SS) available from by Bayer A.G. located in Ludwigshafen, Germany, or PVK poly-N-carbazole available from Aldrich Chemicals, as the hole transport layer. The electron transport/emissive layer can by a poly(fluorene)-based polymer for green emission, and other polymers for red and blue emission, as reported by J. H. Burroughes in the Extended Abstracts of The Fourth International Conference on the Science and Technology of Display Phosphors & 9th International Workshop on Inorganic and Organic Electroluminescence, Sept. 14–17, 1998, at page 133 et seq.

Such green-emitting OLED materials typically provide brightness levels of about 100 cd/m$^2$ and exhibit power efficiencies of about 1, 11 and 5 lumens/watt for the R, G and B materials, respectively.

Displays 10 having 0.5 mm by 1.5 mm monochrome R, G and B sub-pixels to provide 1.5 mm by 1.5 mm color pixels as described are suitable for providing an about 125 cm (about 50 inch) diagonal dimension display in a 640 by 480 pixel format or an about 190 cm (about 75 inch) diagonal dimension display in a 1000 by 750 pixel format, for example. In addition, an 2.7 m wide by 1.6 m high (about 9 feet by 5.3 feet) display 10 in a 1920 pixel by 1080 pixel format is suitable for display of high-definition television (HDTV) images, and would include 3240 horizontal fibers which in groups of three (for R, G, B) provide 1080 color pixels in the vertical direction. In that latter example, it is presently preferred that 108 select line driver circuits 240 drive 108 groups of 30 fibers 100 each and that 60 data line driver circuits 250 drive 32 parallel data line segments 226 each connected to 30 adjacent fibers.

Where it is desired that OLED layer 130 be segmented, for example, into 0.5 mm by 1.5 mm segments, contacts 140 formed thereon may be made slightly smaller, for example 0.4 mm by 1.4 mm, so as to avoid undesirable electrical conduction to ITO layer 120 around the edge of OLED layer 130 as might otherwise occur due to tolerances in the relative positions of segments of OLED layer 130 and contacts 140.

Figure 8:
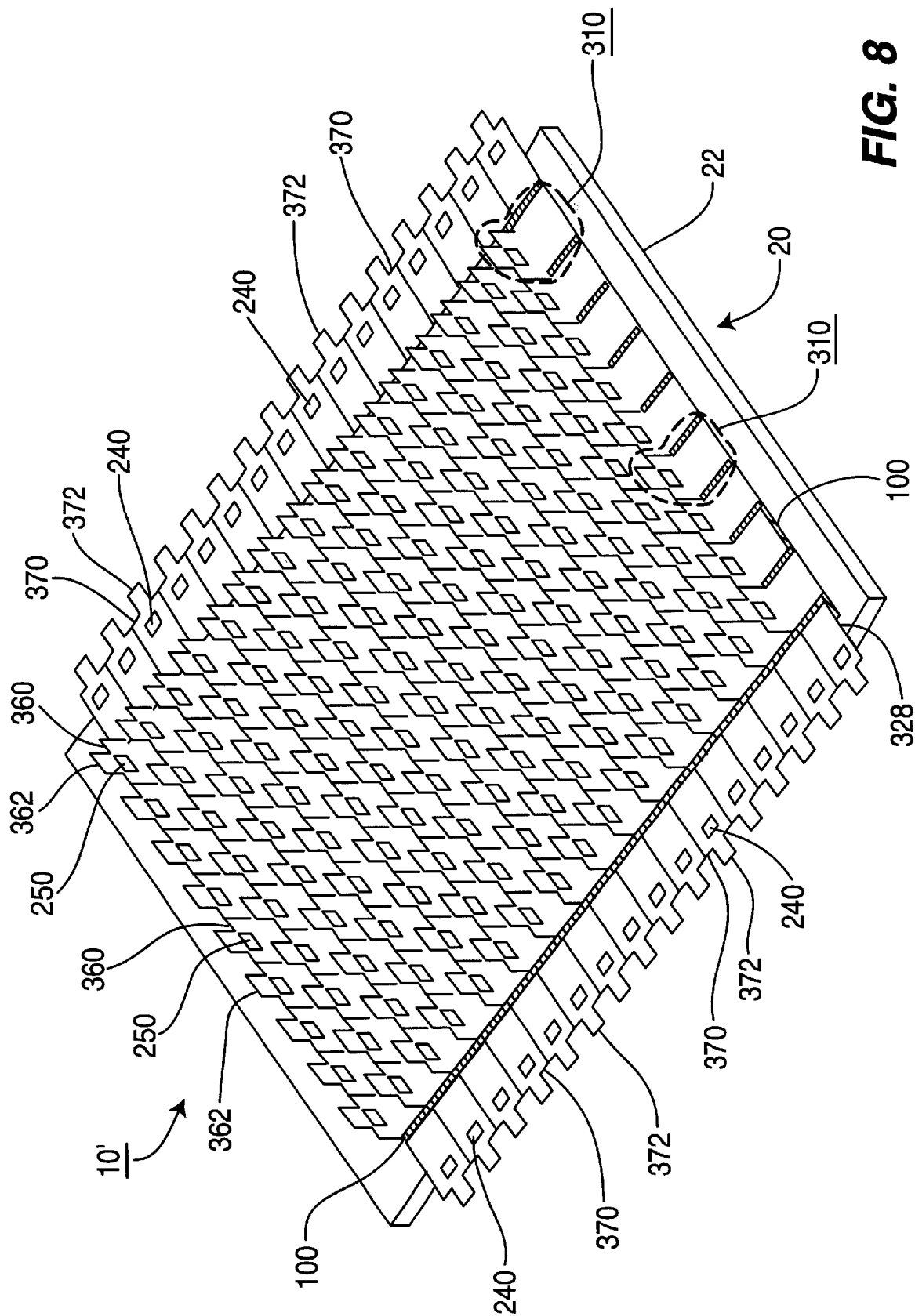
FIG. 8 is a perspective view of an alternative exemplary embodiment of a display in accordance with the present invention.

FIG. 8 is a perspective view of an alternative embodiment of a display 10' in accordance with the present invention in which a plurality of light-emitting fibers 100 are arranged on an optional transparent faceplate 22 that can serve as a viewing surface 20. Light-emitting fibers 100 as described above are arranged side-by-side with the viewing surface 112 thereof against faceplate 22 and the surface thereof having light-emitting elements 150 thereon distal from faceplate 22, i.e. with contacts 140 exposed. Groups of light-emitting fibers 100, e.g., preferably groups of numbers of fibers as described above, each receive select signals from respective select line or row driver circuits 240 which are mounted on flexible circuit boards 370. Circuit boards 370 are mounted along the edges of display 10' proximate the ends of light-emitting fibers 100 and have edge contacts 372 to which an edge connector connects to provide electrical signals representative of information to be displayed by display 10' and have select line conductors 328 that connect to the respective conductors 160, 162 of light-emitting fibers 100 for applying select signals to transparent conductor 120.

Overlying the fibers 100 of display 10' as thus far described are a plurality of flexible circuit boards 360 each forming, in conjunction with a group of adjacent light-emitting fibers 100, a display module 310. In fact, a plurality of display modules 310 are formed by a plurality of flexible circuit boards 360 in conjunction with each group of adjacent light-emitting fibers 100. As may best be appreciated in the expanded perspective view of a section of display 10' shown in FIG. 9A, flexible circuit board 360 has a plurality of data line conductors 326 on the surface thereof facing light-emitting fibers 100. The pitch of data line conductors 326 is the same as the pitch of exposed contacts 140 of fibers 100, so as to facilitate electrical connection therebetween with the respective long directions of fibers 100 and conductors 326 approximately perpendicular to one another. Electrical connections between contacts 140 and corresponding data line conductors 326 are made with electrically-conductive epoxy or other electrically-conductive adhesive, solder, or other suitable material. One end of circuit board 360 is bent to extend away from fibers 100 and has edge contacts 362 for receiving via an edge connector electrical signals representative of information to be displayed. The bent away end of circuit board 360 also provides a location at which data line or column drive circuit 250 is mounted to receive electrical signals from edge contacts 362 and provide data line drive signals via data line conductors 326 to drive, for example, preferably groups of adjacent light-emitting elements 150 of each fiber 100 as described above, thereby permitting addressing of each pixel.

It is presently preferred that rows and columns of display 10' be driven by select line driver circuits 240 and data line driver circuits 250 in groups of fibers 100 and of pixels 150, respectively, in like numbers to that described above in relation to display 10. e.g., groups of 30 and 32, respectively. This arrangement facilitates the preferred direct multiplex addressing of subsets of pixels that allows convenient expansion or contraction of the size, either in width or height or both, of display 10'.

As a result, display 10' is easily connected and disconnected via edge connectors to edge contacts 362, 372, thereby facilitating assembly and disassembly of display 10' into other apparatus. Further, display 10' also provides the advantage of progressive assembly that permits testing, and, if necessary, repair, of components and elements before they are assembled into more expensive subassemblies and assemblies. For example, light-emitting fibers 100 are tested prior to mounting to transparent faceplate 22, and select line driver circuits 240 and data line driver circuits 250 are each tested before being mounted to circuit boards 370 and 360, respectively. In turn, circuit boards 360 and 370 are tested with drive circuits 250, 240, respectively, mounted thereon before assembly with groups of fibers 100, and so forth. Thus, any defective or imperfect component or element can be identified, and be replaced or repaired, at minimal expense.

Figure 10:
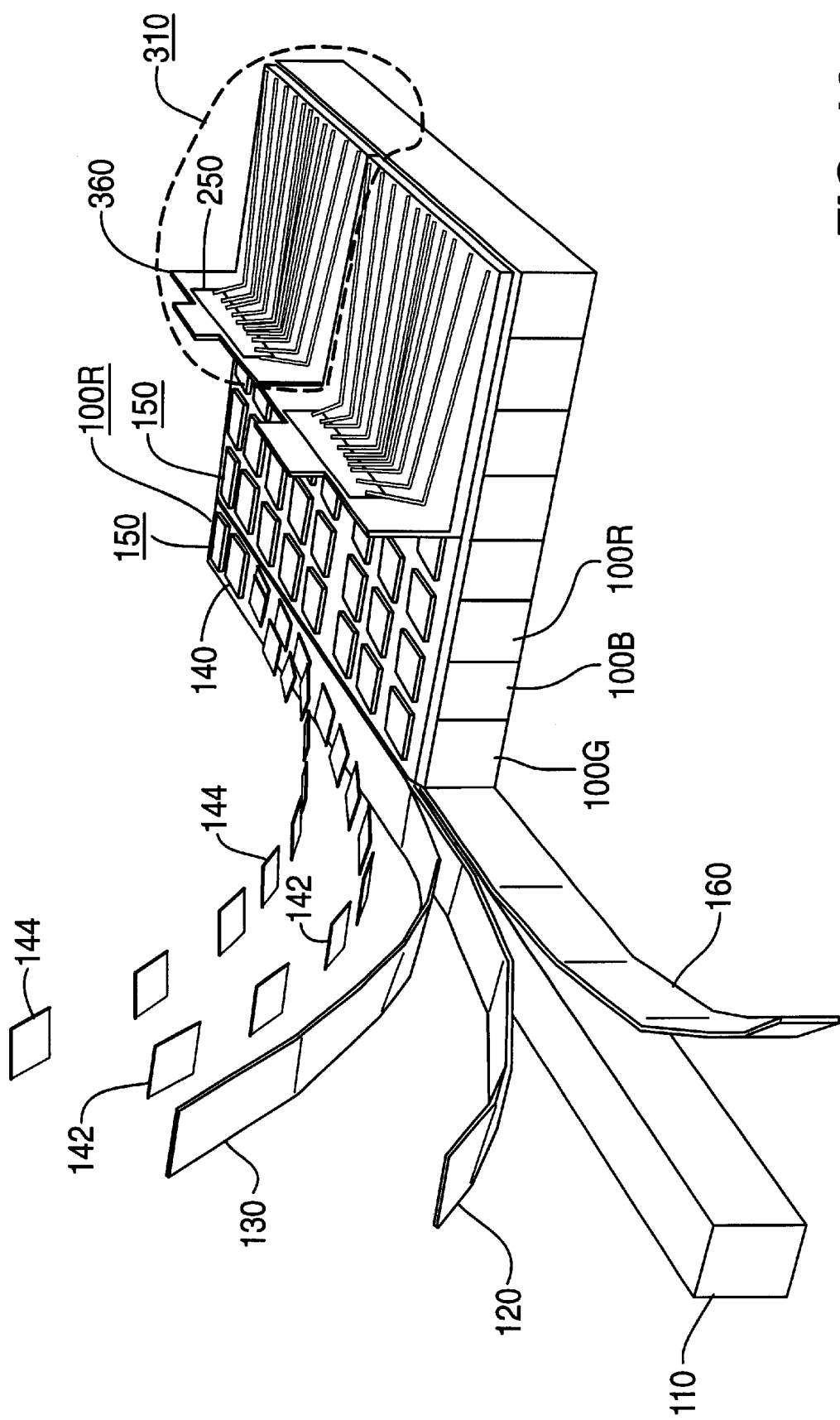
FIG. 10 is a representation illustrating a fabrication sequence according to the present invention useful in relation to the exemplary display of FIG. 8.

This exemplary useful assembly sequence is illustrated in FIG. 10 by proceeding generally from left to right. Transparent fiber 110 receives a sputtered ITO conductor layer 120 and a sputtered metal conductor 160. An OLED layer 130 is coated over ITO layer 120 and segmented contacts 140 formed thereon by evaporative deposition of magnesium 142 and then of silver 144, thereby forming light-emitting elements 150 along transparent fiber 110. Plural light-emitting fibers 100 are arranged side-by-side with close spacing to assemble a display 10' panel and plural flexible circuits 360 are connected thereto to form display modules 310 of the illustrated portion of display 10'. These assembly operations may be automated to further reduce the assembly cost of displays according to the present invention. A substantial number of display modules 310 are thus formed in close side-by-side arrangement with minimal gaps therebetween. It is noted that the combination of closely spaced light-emitting fibers 100 with closely spaced light-emitting elements 150 thereon produces a large area display 10, 10' that is free of seams and inactive areas on the display surface thereof, and yet has the advantages associated with the modular construction such as is afforded by the closely-spaced display modules 310.

Alternatively, display 10' may be assembled in modular fashion, as may be convenient to further minimize the waste should defective components or assembly occur. In this alternative process, groups of a convenient number of light-emitting fibers 100, for example, two groups of 30 adjacent fibers 100, are assembled into a subassembly with two pre-tested circuit boards 370 each including one select line driver circuit 240. Such subassembly is 60 fibers high and extends the full width of display 10' as defined by the length of light-emitting fibers 100. Pre-tested circuit boards 360 including data line driver circuits 250 each preferably addressing a subset of $2^n$ parallel pixels 150, such as a subset of 32 pixels, are then assembled to such subassembly to complete a "sub-panel" that is 60 fibers high and the full width of display 10' wide. These sub-panels may be tested before a number of sub-panels are positioned adjacent one another to form display 10'. It is noted that the fibers 100 may be arranged to lie in the direction of either the width of display 10' or the height of display 10', as may be convenient, with the data lines 326 lying orthogonal thereto.

A display 10' as described will display an optically monolithic or unitary image, even though the electronic circuitry driving the light-emitting fibers 100 are electrically tiled by being provided into display modules 310 for addressing display 10' in a modular fashion. Based upon reports of the performance of multiplexed panel displays such as reported by Y. Fukuda et al in Society for Information Display International Symposium, Digest of Technical Papers, May 1999, (SID 99 Digest), at pages 430-433, display 10' has the potential to provide high-brightness at high luminance efficiency (e.g., about 150 Cd/m$^2$ at 0.6 Lm/W where 120 select lines are multiplexed as a group driven by one select line driver circuit 240; about 600 Cd/m$^2$ at 2.4 Lm/W where 30 select lines are multiplexed as a group), high resolution (e.g., 32 lines/cm or 80 lines/inch), and a color gamut comparable to a CRT, all in a display that is substantially larger than is practical for a CRT. Typically, transparent faceplate 22 may be about 1.5 mm (about 0.060 inch) thick, and have 0.5 mm by 0.5 mm (about 0.020 by 0.020 inch) transparent fibers 110 mounted thereon, preferably placed by automated and/or robotic equipment. Flexible circuit boards 360, 360 may be of about 50 μm (about 0.002 inch) thick polyimide, polyester, FR4 or other suitable material, and are also preferably placed by automated and/or robotic equipment.

Figure 9A:
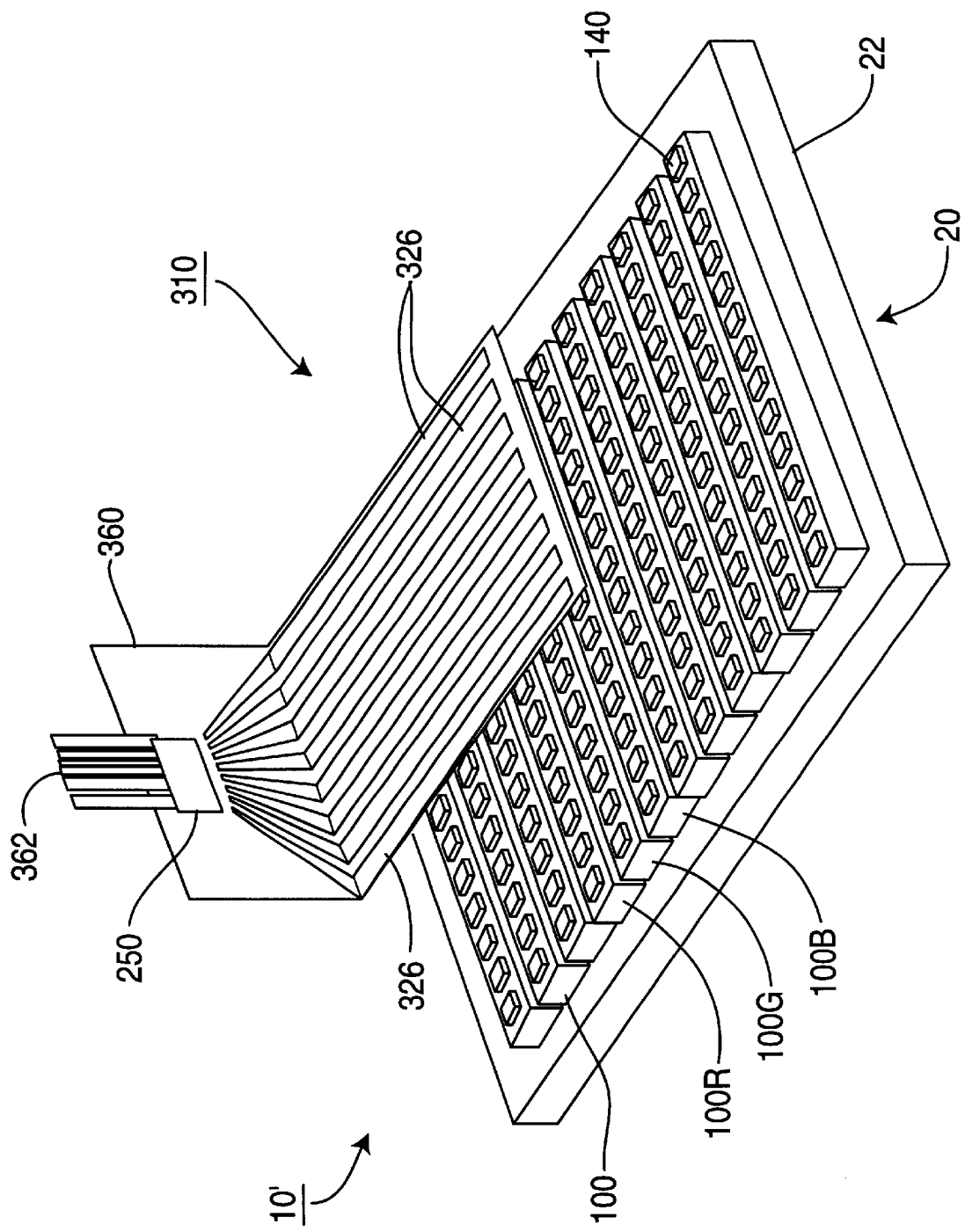
FIGS. 9A and 9B are expanded perspective views and FIG. C is a plan view of alternative embodiments of respective sections of the display embodiment of FIG. 8.
Figure 9B:
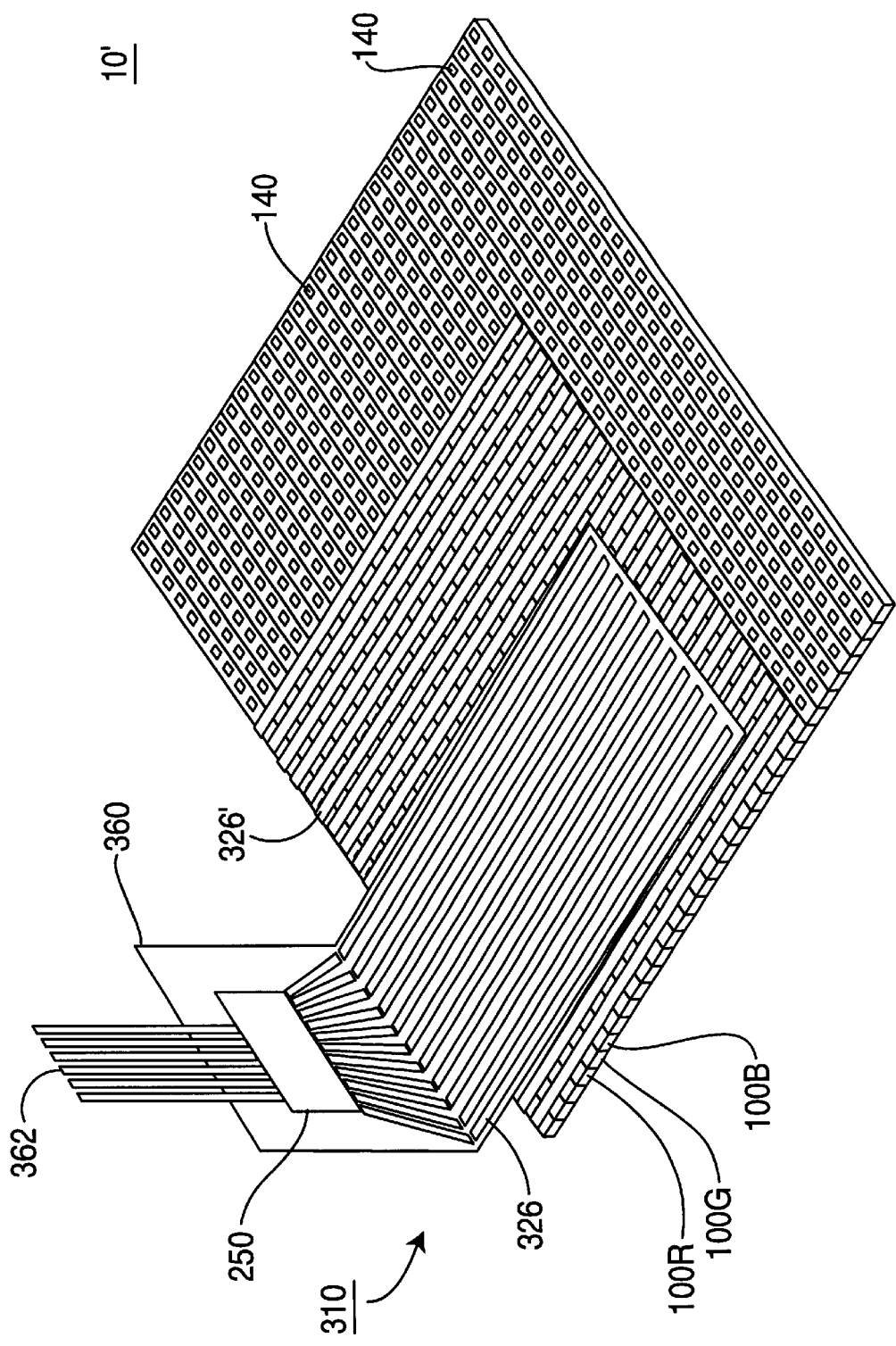
Figure 9C:
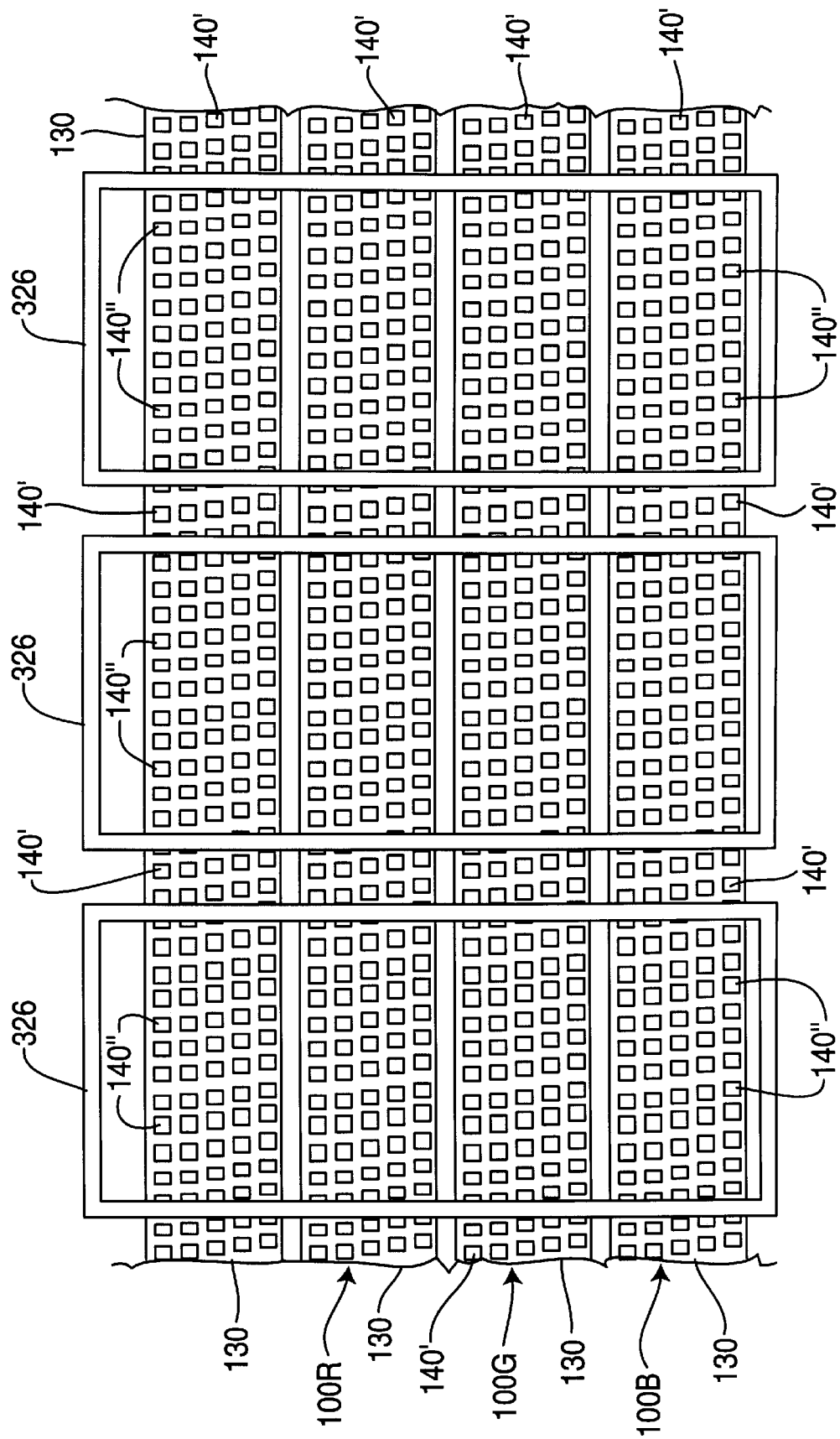

Alternatively, as illustrated in FIG. 9B, after one or more subsets of light-emitting fibers 100 are located on transparent faceplate 22, the equivalent of data line segments 326 of flexible circuit 360 may be formed in place by employing conventional deposition techniques. Conductive epoxy bumps can be deposited, such as by screen printing, onto the contacts 140 of light-emitting fibers 100 followed by deposition of data line segment buses 326' connecting selected groups of contacts 140. Then, flexible circuit board 360 including data line driver circuit 250 is attached, as by screen-printed conductive epoxy connections to deposited data busses 326'. Optionally, transparent faceplate 22 may be removed, as illustrated.

In assembly of the arrangements of FIGS. 9A and 9B, data line conductors 326 are positioned so as to contact the appropriate conductive adhesive bumps on contacts 140 of fibers 100 (e.g., R, G, B fibers 100R, 100G, 100B), and conductive adhesive stripes 326' are positioned so as to overlie the appropriate contacts 140. For a large-area display 10', the build up of tolerances or stretching of fibers 100 could detract from the ease of assembly of the present arrangements. To reduce the need to precisely position conductors 326 with respect to the contacts of the light-emitting elements 150 of fiber 100, large contacts 140 that represent an entire pixel on fiber 100 are replaced by an array of smaller contacts 140' that are spread over the surface of OLED material 130 of fiber 100. Some of contacts 140' are designated as 140" as is explained below. While each small contact 140' defines a small light-emitting element (sub-sub-pixel), no contact 140' is associated with a particular pixel 150 (i.e. a sub-pixel of a color pixel) of fiber 100 standing alone as a fiber. Each of contacts 140' has anisotropic electrically-conductive adhesive deposited thereon, for example, as a uniform film or as a bump.

When data line conductors 326 of circuit boards 370 are assembled to fibers 100, each is electrically connected to a group of contacts 140' by the conductive epoxy thereon. The contacts 140' that are electrically connected to conductors 326 are shown blacked in and designated 140" in FIG. C. Thus, the sub-pixels 150 provided by each fiber 100 are defined by the contacts 140"(sub-sub-pixels) to which conductors 326 connect after assembly, and so are free of tolerance associated with the length of fibers 100 or their relative longitudinal positions. The sub-pixels associated with those of contacts 140' that are between and not connected to conductors 326 and not powered and so are inactive. While some loss of light output will obtain because no light can be emitted by that portion of the OLED material 130 that is not directly under a contact 140', this can be offset by increased emission from the OLED material as a result of increased field strength at the perimeter of each pixel.

For a typical exemplary fiber having, for example, a 0.75 mm by 0.25 mm subpixel size, an array of 0.075 mm by 0.025 mm contacts 140' can be employed consistently with mesh screen mask deposition in the continuous process described below. A quantization error of about 1 pixel out of 60 pixels will result due to the arbitrary positioning of the conductors 326 over the array of sub-sub-pixel contacts 140', but can be reduced by reducing the size of the sub-sub-pixel contacts 140' if more precise deposition techniques are used, or by increasing the size of the sub-pixel. One advantage of this arrangement is that "blind" assembly of display 10' becomes more attractive, such as where conventional rigid printed circuit boards are employed as circuit boards 360 for modules 310 or a complete display 10'.

An additional advantage of the arrangement having a plurality of display modules that each process the image-representing signals for a group of pixels in a particular area of the display 10, 10' is that the data signals to these groups of pixels may be quickly refreshed, aided by parallel processing in the various display modules 310, so as to provide the display of full color, full motion video images. The low potentials of less than about 10 volts required to drive each pixel 150 are easily provided. Because the OLED is actually an electrical diode, contrast ratios of greater than 100 are easily obtained with direct multiplex addressing of the OLED elements.

It is noted that transparent faceplate 22 may be a flexible transparent material that allows, since light-emitting fibers 100 and flexible circuit boards 360, 370 are also flexible, display 10' to be shaped, such as into a curved display as illustrated in FIGS. 1A and 1B, for example. Transparent faceplate 22 may be used as an assembly aid to which fibers 100 are temporarily adhered in a desired position, and may be removed after assembly of display 10' so the displayed information is directly viewable on the exposed surfaces of the light-emitting fibers comprising display 10'.

An important aspect of the displays 10, 10' described above is the light-emitting fibers 100 utilized therein. While light-emitting fibers 100 may be fabricated in various ways, fibers 100 are preferably fabricated according to the method described below in relation to the apparatus of FIGS. 11–14. In this method, a linear fiber of virtually any desired length may be fabricated in a continuous process that does not require a large area vacuum environment or a large area clean room, but which employs small-bore apparatus. Moreover, this method may employ simple mechanical masks, thereby avoiding certain difficult or expensive conventional processes, such as multiple-mask-based lithography or photolithography, for example. By avoiding such processes, and the need for expensive large-area processing as is needed for CRTs where the entire faceplate and shadow masks are each fabricated in a single operation, light-emitting fibers 100 and displays 10, 10' employing same, may be made efficiently and at reasonable cost.

Figure 11:
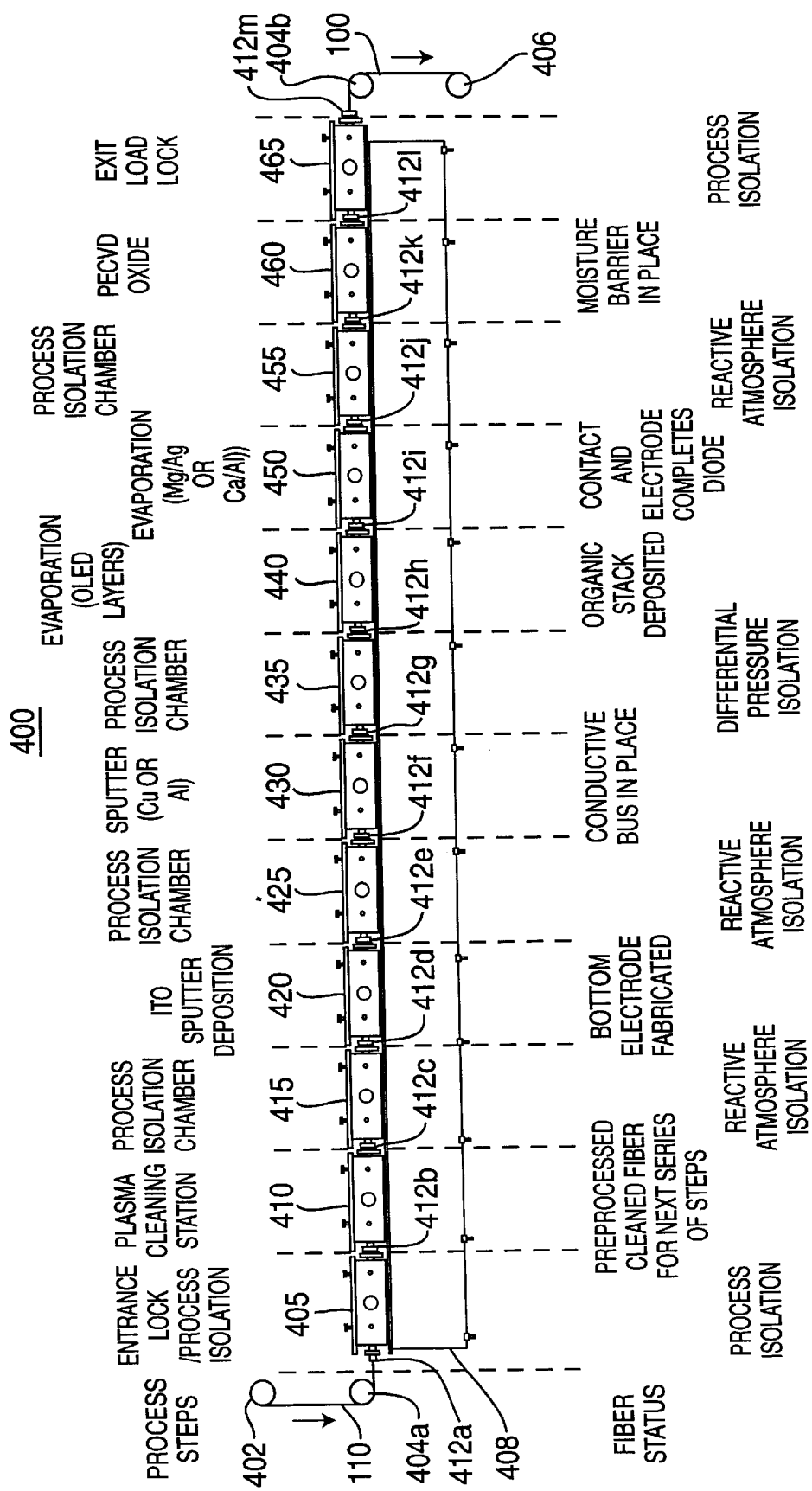
FIG. 11 is an elevation of an exemplary manufacturing apparatus according to the present invention useful in making light-emitting fibers according to the present invention.

In FIG. 11, apparatus 400 includes a plurality of separate processing chambers 405, 410, 415, 420, 425, 430, 435, 440, 450, 455, 460, 465 through which a transparent fiber moving from a supply reel 402 to a take-up reel 406 passes. In this in-line processing arrangement, the transparent fiber 110, guided by guide rollers 404a, 404b enters and exits from each of the chambers 405–465 via long thin passage that serves as an isolation lock, each of which is akin to an "air lock". Each isolation lock 412a, 412b, . . . 412m includes has small bore entrance and exit openings that closely conform to the cross-sectional size and shape of the transparent fiber 110, 110' passing therethrough, and may also have flanges for convenience in assembling ones of processing chambers 405–465 to each other and may be pumped to maintain a partial vacuum therein. Thus are established a plurality of small, isolated processing chambers 405–465 or "clean spaces," each for performing a different one in a series of steps of the method of fabricating a light-emitting fiber 100, preferably under vacuum conditions. Chambers 405–465 may be arranged on bench 408, for example.

Unprocessed transparent fiber 110 from supply reel 402, which may initially contain hundreds or thousands of meters of transparent fiber 110, is preferably cleaned at plasma cleaning chamber or station 410 by being exposed to a plasma therein, such as a plasma of oxygen ($O_2$) in preparation for the subsequent deposition of various materials on fiber 110. Next, a thin optically-transparent conductive layer 120, such as ITO, is deposited, such as by vacuum sputtering, onto one face or surface of the cleaned fiber 110 as it passes through ITO sputter deposition chamber 420, thereby forming the transparent electrode conductor 120 of light-emitting fiber 100. A layer of conductive metal, such as aluminum is deposited, such as by evaporation or sputtering, along the sides of partially processed fiber 110' to form conductors 160 and/or 162 thereon. It is noted that metal conductors 160, 162 may be formed at any position in the processing of transparent fiber 110 into light-emitting fiber 100, either before or after the deposition of IFO layer 120, but preferably before deposition of the OLED material, for example, by sputtering in sputter deposition chamber 430. Next, a stack of layers of light emissive material, such as an OLED material, is deposited, such as by evaporation, onto the partially processed fiber 110' as it passes through evaporation chamber 440 to partially form the light-emitting element 150 of fiber 100. Next, as fiber 110' passes through processing chamber 450, a segmented patterned layer of magnesium (or calcium) is deposited, such as by evaporation, onto the OLED material layer to form the second electrode 142 of light-emitting element 150 and conductive metal (silver over magnesium, or aluminum over calcium) is also deposited, such as by evaporation also, in a like segmented patterned layer 144 overlying segmented electrodes 142, thereby to complete contact 140. In processing chamber 460, an insulating moisture barrier providing material, such as silicon nitride or diamond-like carbon, is deposited to cover all of the OLED material, while leaving at least a central portion of contact 140 exposed, such as by plasma chemical vapor deposition (CVD), as described in detail below with reference to FIG. 13, for example.

Before processing chamber 410 and between processing chambers 410 and 420, 420 and 430, 430 and 440, 450 and 460, and following processing chamber 460, are process isolation chambers 405, 415, 425, 435, 455 and 465, respectively. Each process isolation chamber 405, 415, 425, 435, 455 and 465 is maintained under a vacuum condition, and may also include an inert gas purge such as a nitrogen purge, to prevent the reactive atmosphere of a preceding processing chamber from passing through to a subsequent processing chamber and contaminating the reaction to be performed therein, or from escaping to the external atmosphere. An advantage of this arrangement is that the total length of the processing line is relatively short, and minimizes the volume of the processing chambers and their cost to obtain and maintain. Processing chambers 405–465 may be arranged in a line or in a serpentine or other layout on bench 408, as is convenient, and the apparatus and arrangement described lends itself to high-volume, low-cost, continuous, automated processing of light-emitting fibers 100.

Fiber 110 may be moved from supply reel 402 to take-up reel 406 by either a continuous motion or a step and repeat motion, as is convenient. Alternative apparatus arrangements are likewise suitable. For example, where the transparent fiber 110 on supply reel 402 is a pre-processed quartz fiber that has been coated with an ITO layer 120, and/or conductors 160, 162, or other suitable layer during its manufacture, e.g., immediately after the quartz fiber is grown, then the steps performed in processing chambers 420 and 425 may be eliminated. The processing may be partitioned so that various ones of the steps are performed at different times or at different locations, as is convenient.

Figure 12:
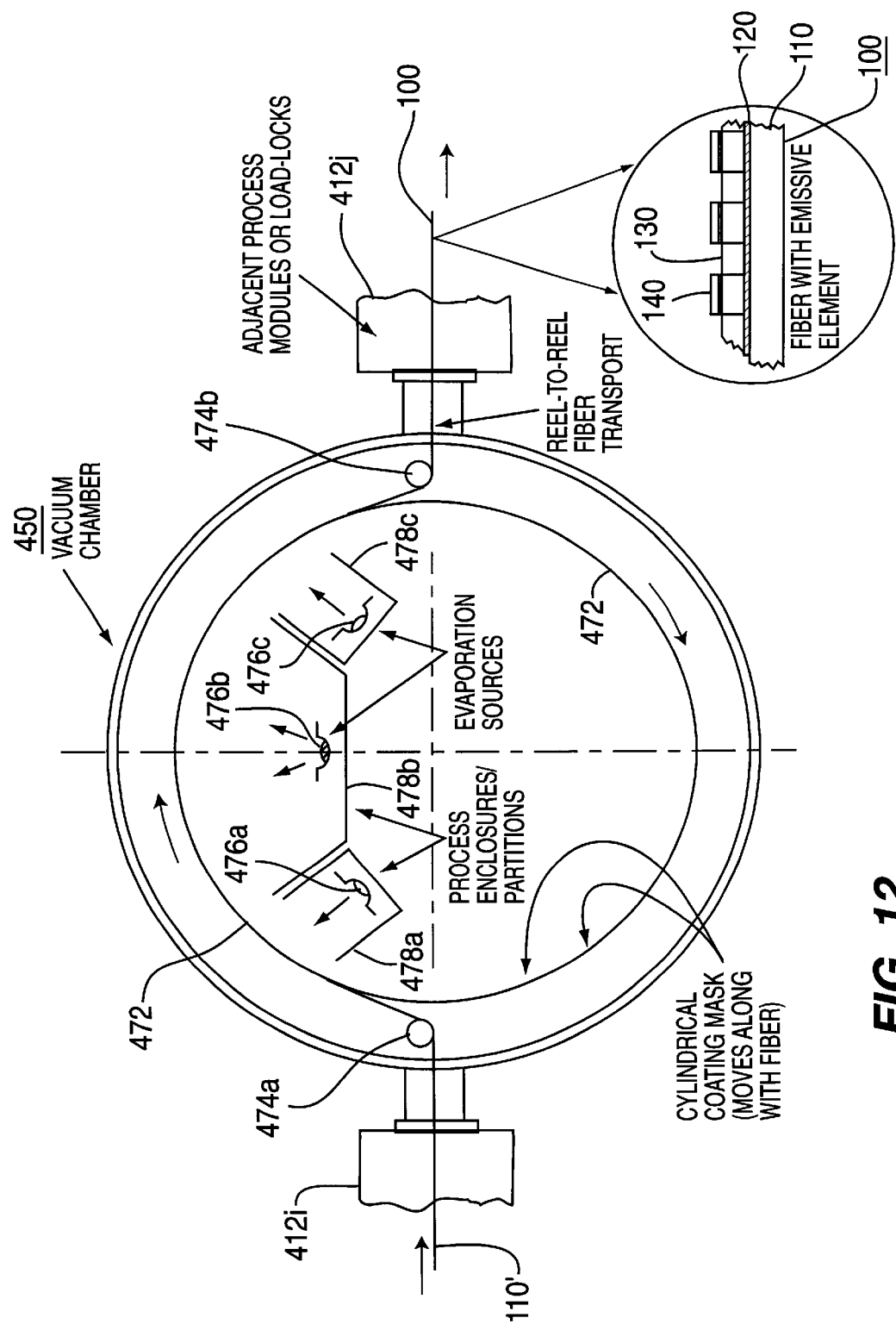
FIG. 12 is a cutaway view of an exemplary station of the apparatus of FIG. 11.

The internal arrangement of an exemplary processing chamber, for example, processing chamber 450, is shown in cross-section in FIG. 12. Partially-processed transparent fiber 110' enters vacuum chamber 450 via the small-bore opening of lock 412i and exits via the small-bore opening in lock 412j. Within vacuum processing chamber 450, fiber 110' conforms to the surface of a moving mask, such as rotatable cylindrical mask 472 that is rotated at a rate so that its mask surface moves at the same speed as does fiber 110'. Fiber 110' is guided onto cylindrical mask 472 by roller 474a and off of cylindrical mask 472 by roller 474b. Cylindrical mask 472 and rollers 474a, 474b may be idlers, or may be driven, such as by a servo-controlled drive, to impart motion to moving mask 472 and fiber 110'. Because the same masking pattern is employed for depositing the electrode 142 on the OLED layer 130 and the metal contact 144 on the electrode 142, one cylindrical mask 472 is utilized with plural deposition sources to accomplish all the depositions.

To that end, a plurality of deposition stations are located within processing chamber 450 central to cylindrical mask 472, i.e. on the opposite side of cylindrical mask 472 from partially processed fiber 110'. Fiber 110' is oriented with its surface having the OLED layer 130 in contact against cylindrical mask 472 to receive the pattern of electrodes 142 and metal contacts 144 thereon. Each deposition station includes a respective source 476a, 476b, 476c of the material to be deposited, such as an evaporative source 476a of magnesium (or calcium) for electrode 142, an evaporative source 476b of a mixture of magnesium and silver (or of calcium and aluminum over calcium) for a transition layer, and an evaporative source 476c of silver (or aluminum over calcium/aluminum) for contact 144. Each source 476a, 476b, 476c is surrounded by a respective process enclosure or partition 478a, 478b, 478c that extends proximate the inner surface of cylindrical mask 472, so that each respective evaporated material is deposited through the cylindrical mask 472 only for the portion of mask 472 that is passing over the respective source 476a, 476b, 476c thereof. Thus, three (or other convenient number) of compatible depositions may be performed within one processing chamber using a single moving mask. As a result, the structure of light-emitting elements 150 on light-emitting fiber 100 is completed upon fiber 100 exiting processing chamber 450.

It is noted that because ITO layer 120, OLED layer 130 and conductors 160, 162 are all continuous along transparent fiber 110, there is no need to synchronize or otherwise align the angular positions of the respective moving masks, e.g., the rotating cylindrical masks, employed within the separate processing chambers 420, 430, 440, 450 and 460 with respect to transparent fiber 110, 110' passing therethrough. It is desirable, however, that the rate of motion of the moving masks, i.e. the rate of rotation of the respective cylindrical masks, within processing chambers 420–460 be controlled so as to maintain a relatively uniform tension on fiber 110, 110' throughout the processing.

Processing steps can easily be added to or removed from the processing arrangement of FIG. 11 simply by adding processing stations and/or processing chambers to the processing line or by removing processing stations and/or processing chambers therefrom. For example, testing of each pixel could be accomplished by moving contacts moving at the same rate as does fiber 100 to contact and apply an electrical test potential to contacts 140 and conductors 160, 162 at a location subsequent to processing chamber 450. Moreover, the described arrangement lends itself to continuous high-speed processing of long lengths of transparent fiber 110 thereby tending to further the uniformity of pixel elements 150.

In addition, because presently available polymer OLED materials exhibit a lifetime of about 15,000 hours in a moisture-free, inert gas environment, it may be desired to obtain comparable lifetime of the OLED material when moisture or reactive gases will be present. Thus, it may become desirable to coat the OLED layer 130 of light-emitting fiber 100 (i.e. the exposed portions of OLED layer 130 not covered by contact 140) with a barrier coating, such as a silicon nitride, silicon dioxide, diamond-like carbon, phosphorus-silicate glass or other suitable coating, to preclude, or at least reduce, moisture or reactive gas infiltration. To apply this additional coating, a processing chamber 460 is inserted between processing chambers 440 and 465 for the deposition of the coating material, such as by evaporation or sputtering. Because the coating material is deposited to cover the OLED material layer 130, but must not cover contact 140, a single inexpensive simple cylindrical mask can not be employed. The coating material is preferably deposited after, but may be deposited before, contacts 140 and metal conductors 160, 162 are formed. The electrically-conductive epoxy by which electrical connections are subsequently made to contacts 140 further seals the top area of OLED material 130 at contacts 140 against moisture or reactive gas. A complex three-dimensional rotatable cylindrical mask having plural support structures extending into the central region of the cylindrical mask to support the plural parts of the mask that cover contacts 140 could be utilized, except such mask is quite complex to fabricate, and therefore quite expensive.

Figure 13:
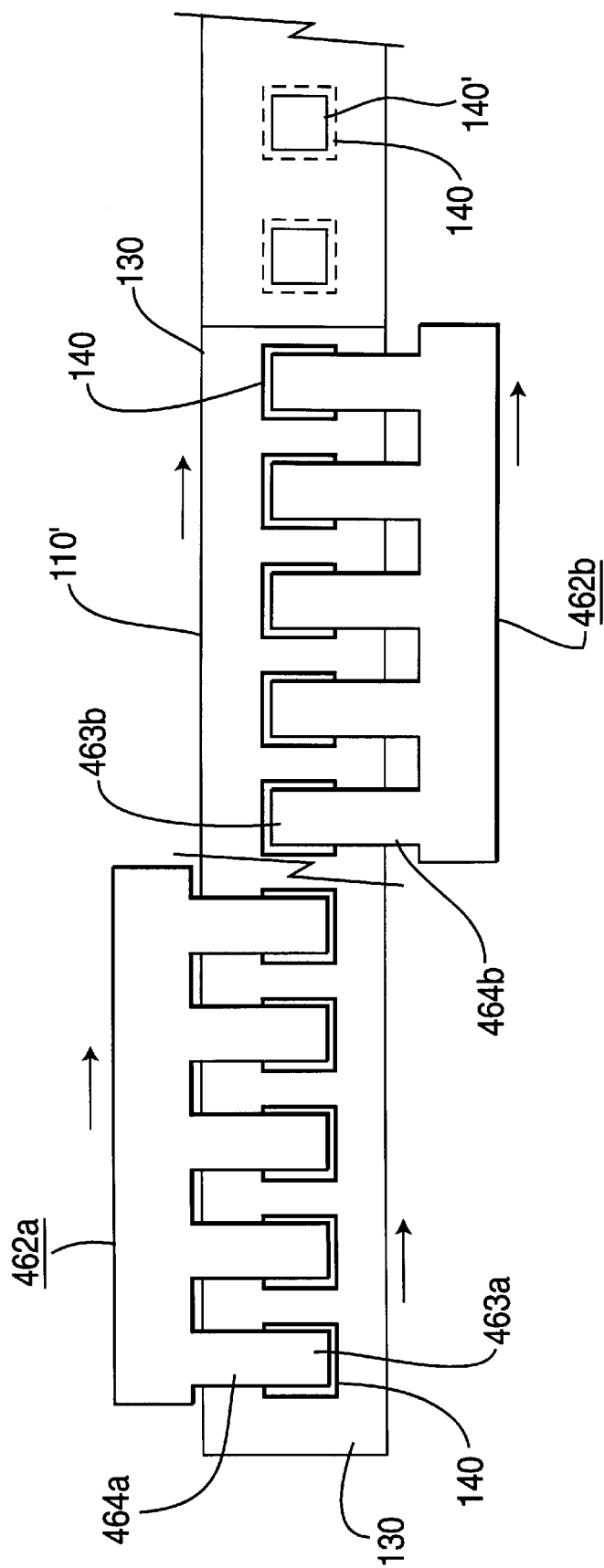
FIG. 13 is a plan view of an exemplary masking arrangement useful in the apparatus of FIG. 11.

A less expensive and simpler moving mask arrangement, illustrated in FIG. 13, employs two simple moving masks 462a, 462b, which are utilized successively during two respective successive depositions of the coating material. Each of moving masks 462a, 462b, which may be rotatable cylindrical masks, has a mask feature 463a, 463b, respectively, that is sized, shaped and positioned to cover the area on OLED layer 130 occupied or to be occupied by the central region of contact 140. The first mask feature 463a is supported by a first mask structure 464a extending transversely over partially processed fiber 110' from one direction and the other mask feature 463b is supported by mask structure 464b extending transversely over fiber 110' from the opposite direction. Thus, the first deposition utilizing moving mask 462a deposits "⌐"-shaped areas of coating material defined by mask feature 463a on OLED layer 130 surrounding each contact 140 location and the second deposition utilizing moving mask 462b deposits "⌐"-shaped areas of coating material defined by mask feature 463b on OLED layer 130 surrounding each contact 140 location, wherein the combinations thereof combine to form contiguous "□"-shaped areas of coating material surrounding each contact 140 location, and leaving a central area 140' of each contact 140 exposed for making electrical contact.

Figure 14:
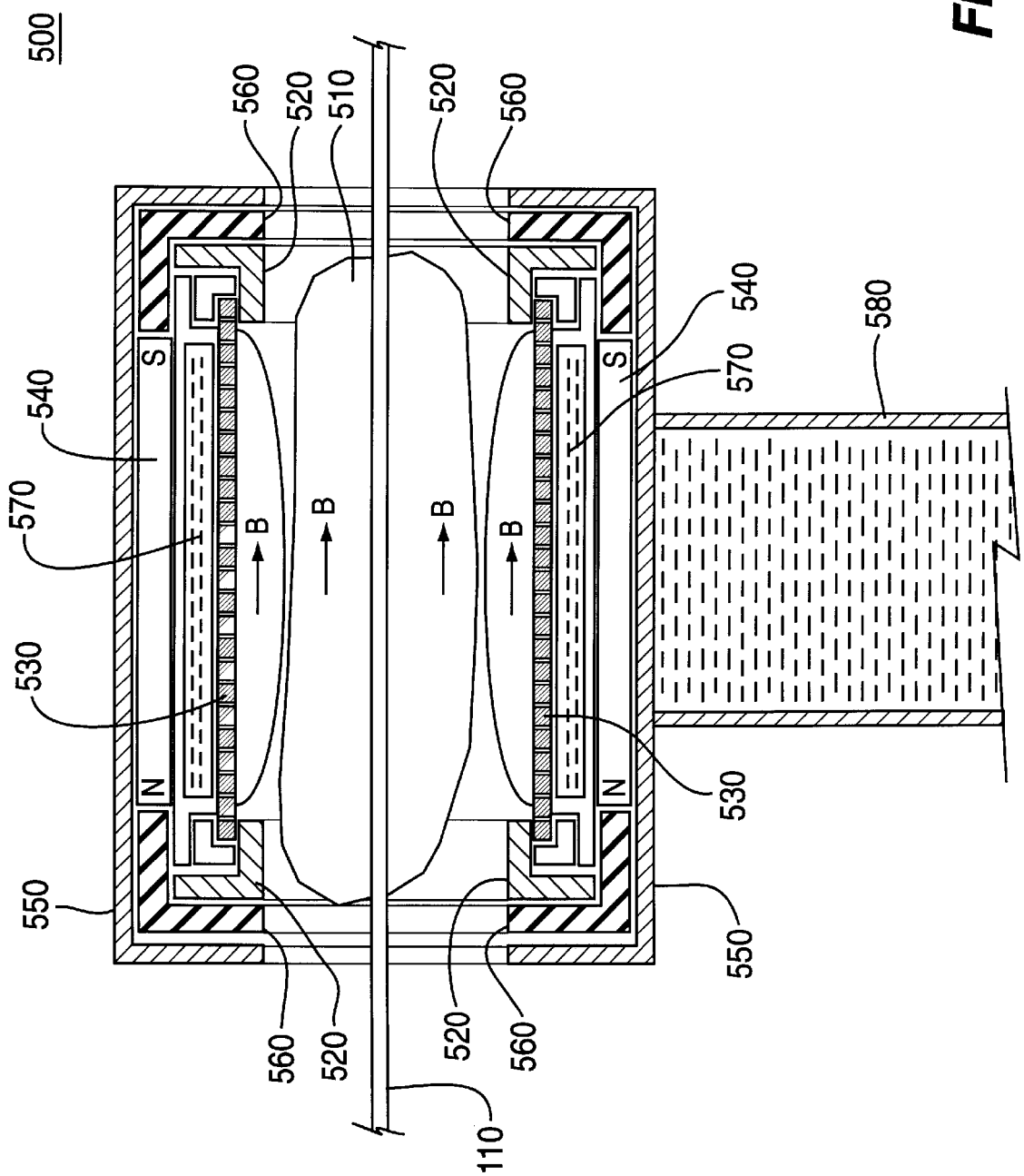
FIG. 14 is a cross-sectional schematic diagram of an exemplary plasma source useful in the apparatus of FIG. 11.

Deposition of the various metal, insulator and OLED layers may be performed by evaporation, sputtering, chemical vapor deposition (CVD) or other suitable means, using a suitable plasma source, such as a parallel-plate RF-excited plasma source or a cylindrical magnetron plasma source. FIG. 14 is a cross sectional schematic diagram of an exemplary cylindrical magnetron plasma source 500 that provides an intense, uniform plasma advantageous for high-rate CVD and sputter deposition. Fiber 110 moves axially through the plasma 510 in the central cavity of cylindrical magnetron plasma source 500 which includes a plurality of coaxially located cylindrical elements. Plasma 510 is generated in response to electric field responsive to potential applied between cylindrical anode electrode 520 and cylindrical graphite target or cathode electrode 530, and is confined in the central cavity of cylindrical magnetron 500 by the action of a magnetic field represented by the magnetic field line arrows B. Graphite target 530 is the source of the material which comprises plasma 510 and which is to be deposited on fiber 110. A magnetic field is established in the central cavity of magnetron 500 by cylindrical permanent magnet 540. A grounded metal cover 550 surrounds the foregoing elements and is separated from anode electrode 520 by cylindrical insulator 560. Magnetron 500 includes a cylindrical cooling channel 570 that surrounds graphite target 530 to remove heat therefrom. Cooling channel 570 is filled with a coolant, preferably a flowing liquid coolant, that is provided via tube or pipe 580. Tube 580 also is an RF waveguide through which RF energy is provided to magnetron 500 for exciting plasma 510. Suitable coolants include water, brines, ethylene-glycol solutions and other conventional coolants.

Note that because long lengths of transparent fiber 110 are processed in a continuous processing operation in which each step may be tightly controlled and the entire length of transparent fiber 110 is processed by the same apparatus under substantially identical conditions, i.e. unchanged conditions, the light-emitting elements 150 formed along the entire length of light-emitting fiber 100 are expected to exhibit very uniform in electro-optical performance characteristics, such as uniform brightness. Thus, a display 10 or 10' made of light-emitting fibers 100 from the same processing operation or from nearly contemporaneous processing operations, should produce displays 10, 10' that exhibit substantially uniform brightness over the entire display viewing surface, but at least brightness that, if it varies, varies gradually over the viewing surface so as not to be noticeable to a viewer. This is in distinction to conventional tiled displays that are formed of a side-by-side array of individual display modules, such as CRTs or liquid crystal displays, which, while exhibiting acceptable brightness uniformity across the screen of each display module, typically exhibit objectionable visible brightness differences where their edges abut.

Figures 15A, 15B:
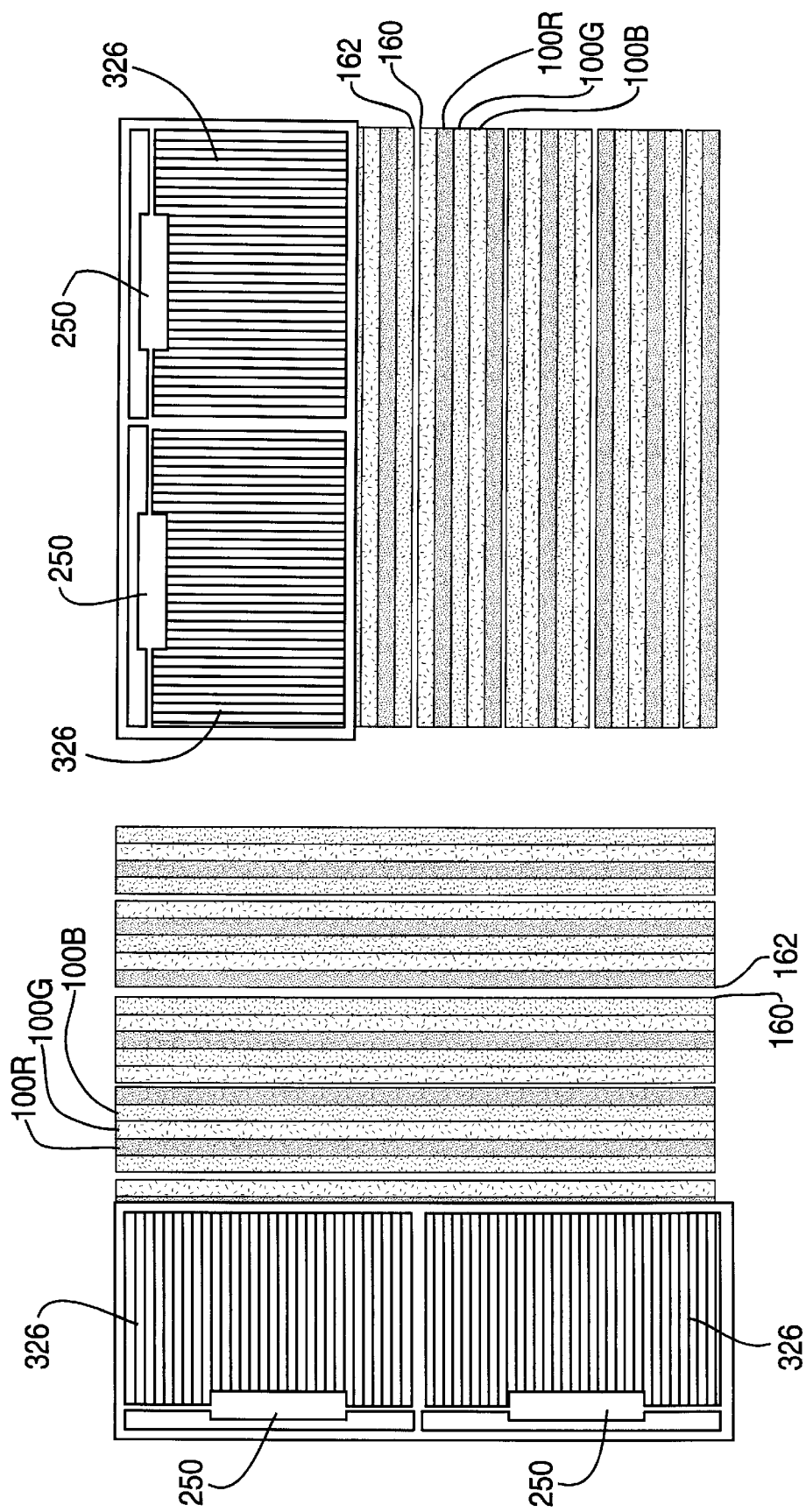
FIGS. 15A and 15B are diagrams of portions of a display representing alternative orientations of the exemplary displays of FIGS. 2 and 8.

For purposes of description only, the fibers 100 are illustrated and are sometimes described as being positioned with their lengths lying in a horizontal direction, although fibers 100 may lie an any desired direction an any particular application of a display 10 including the present invention. In FIG. 15A, for example, fibers 100, conductors 160, 162 thereon and select line conductors 328 are in the vertical orientation and data line conductors 326 are in the horizontal orientation. In FIG. 15B, for example, fibers 100, conductors 160, 162 thereon and select line conductors 328 are in the horizontal orientation and data line conductors 326 are in the vertical orientation. Thus, groups of picture elements may be referred to as being "rows" or "columns" of display 10, although the arrangement of electrical circuits for driving light-emitting fibers 100 may be interchanged, thereby interchanging what are called rows and columns. Likewise, display 10 is shown with a relatively longer horizontal dimension and a relatively shorter vertical dimension, and with a generally planar viewing surface 20, as is customary for television and cinema screens, although any aspect ratio, i.e. the ratio of the horizontal dimension to the vertical dimension, and various curvatures and shapes, may be employed in any particular application of a display 10 including the present invention. In addition, the actual orientation of the items described as horizontal or vertical need not be in a horizontal or vertical orientation. Light-emitting fibers 100 may extend horizontally across the width of display 10 or vertically along the height thereof, or otherwise, as is convenient, thereby producing a visually "seamless" large area display 10, i.e. a display not having seams or non-image regions at the edges of adjacent display devices that are stacked or tiled in a matrix to form a larger display.

Among the advantages of the arrangements described herein are the ability to provide large-area, high-brightness, high-resolution, full-color displays using a low-cost, modular approach that avoids the expense and waste of conventional large-area displays. Displays according to the present invention do not require tiling of display segments, and so are optically seamless and tend to provide improved display brightness uniformity, even though the electrical operation of the display or the supporting electronic circuits may be modular or tiled. Displays greater than 150 cm by 150 cm (about 60 inches by 60 inches), and 250 cm by 250 cm (about 100 inches by 100 inches), for example, displays having a diagonal greater than 3.6–3.7 m (about 12 feet), are practical, as are displays having a format of 1000 pixels by 1000 pixels, or more. Display panels of 150–250 cm on a side may conveniently be arranged in side-by-side array to form even larger displays, such as for teleconferencing screens, billboards and/or scoreboard displays. Nonetheless, the arrangement is also advantageous for smaller displays, e.g., a 75 cm by 100 cm (about 30 by 40 inches) employing about 1000 fibers each about 75 mm (about 30 inches) long. If, however, smaller displays and/or higher resolution displays are desired, such could be made in accordance with the present invention by employing lithographic techniques to define smaller pixels.

Further, the relatively large-area pixels (e.g., 0.5 mm by 1.5 mm) allow fabrication by sequential layering techniques without the need for expensive precision processing, such as by lithography, and are large enough to allow connection thereto to be easily made. Inexpensive conventional printed circuit boards and simple, inexpensive direct addressing of light-emitting elements may be employed.

Moreover, displays including the present invention may be thin and may be flat, curved or otherwise non-planar, and may be rigid or flexible. Flexibility obtains as a result of the flexibility of the thin optical light-emitting fibers and the flexible circuit boards that may be employed, and even if the flexibility of the light-emitting fibers is limited, the display will be flexible about an axis parallel to the direction in which the light-emitting fibers lay. Such flexibility, even if not utilized to flex a display, tends to make the display less susceptible to breakage. Further, since the display is formed of a substantial number of independent light-emitting elements along many independent light-emitting fibers, and employs many separate electrical circuit boards and electrical drive circuits, it tends to be lightweight and quite robust, and is likely to remain useful under severe field conditions, including, for example, shock, vibration and/or puncture by a projectile, that cause failure of individual pixels or fibers, or of groups of pixels or fibers.

While the present invention has been described in terms of the foregoing exemplary embodiments, variations within the scope and spirit of the present invention as defined by the claims following will be apparent to those skilled in the art. For example, while OLED materials are preferred, other light-emitting materials, such as inorganic electro-luminescent (EL) materials may also be employed.

Addressing of the pixels of light-emitting fibers 100 may employ addressing as described herein or may even employ direct addressing of each element 150.

Similarly, connection arrangements other than those described herein may be employed, such as connections to the select lines of light-emitting fibers 100 may be made by connections to ITO electrode 120 or to metal conductor 160 and/or 162 at either or both ends of fibers 100, or connections may be made to special end contacts formed at one or both ends of fibers 100, which end contacts may be formed at the same time that metal conductors 160 and/or 162 are formed.

Alternative substrates, such as conventional printed wiring circuit boards, both rigid and flexible, as well as thick-film circuits on glass, plastic, ceramic or ceramicon-metal substrates, may be employed. Where a flexible display is desired, addressing of the display light-emitting fibers may employ non-woven fiber optic data conductors for implementing direct addressing of the light-emitting fibers 100.

What is claimed is:

1. A display comprising:
   a plurality of fibers disposed in side-by-side arrangement to define a viewing surface of the display;

a plurality of light-emitting elements disposed along a surface of each of said plurality of fibers opposite the viewing surface of the display, each said light-emitting element having at least a first electrode at which an electrical signal is applied to cause said light-emitting element to emit light; and a plurality of at least first electrical conductors coupled to the first electrodes of said plurality of light-emitting elements to apply at least first electrical signals representative of information to be displayed thereto, thereby causing said light-emitting elements to emit light to display the information on the viewing surface.

2. The display of claim 1 further comprising a first electrical drive circuit for providing said first information-representative signals.

3. The display of claim 1 wherein said plurality of light-emitting elements comprises: a layer of light-emitting material disposed on the surface of each of said plurality of fibers opposite the viewing surface of the display; and wherein the first electrodes of said plurality of light-emitting elements are disposed on said layer of light-emitting material.

4. The display of claim 3 wherein said plurality of light-emitting elements further comprises a second electrode in electrical contact with said layer of light-emitting material.

5. The display of claim 4 wherein said plurality of at least first electrical conductors further includes second conductors coupling second signals representative of the information to be displayed to the second electrode of said plurality of light-emitting elements.

6. The display of claim 5 further comprising a second electrical drive circuit for providing said second information-representative signals.

7. The display of claim 1 wherein said plurality of at least first electrical conductors comprises an electrical circuit board including the plurality of first electrical conductors and a plurality of electrical interconnections coupled between respective ones of the plurality of first electrical conductors and respective first electrodes of corresponding ones of the plurality of light-emitting elements.

8. The display of claim 7 wherein said electrical circuit board is formed of one of a rigid circuit board material, a ceramic circuit board material, a ceramic circuit board material on a metal base, a flexible circuit board material, and a transparent circuit board material.

9. The display of claim 7 wherein said plurality of electrical interconnections are formed of an electrically-conductive adhesive.

10. The display of claim 7 wherein said plurality of electrical interconnections couple to said respective first electrodes of corresponding ones of the plurality of light-emitting elements at one of one end of the fiber and at both ends of the fiber.

11. A fiber-based display comprising:
a plurality of transparent fibers disposed in side-by-side arrangement to define a viewing surface of the fiber-optic display;
a plurality of light-emitting elements disposed along a surface of each of said plurality of transparent fibers opposite the viewing surface of the fiber-optic display, each said light-emitting element having first and second electrodes between which an electrical signal is applied to cause said light-emitting element to emit light;
a source of first and second electrical signals representative of information to be displayed; and
at least one electrical circuit board including:

a plurality of first electrical conductors coupled between said source and the first electrodes of said plurality of light-emitting elements of each particular transparent fiber to apply the first electrical signal thereto, and a plurality of second electrical conductors coupled between said source and the respective second electrodes of corresponding ones of said plurality of light-emitting elements of a group of adjacent ones of said plurality of transparent fibers to apply the second electrical signal thereto;

thereby causing said light-emitting elements to emit light to display the information on the viewing surface.

12. The fiber-based display of claim 1 wherein said source includes at least one first electrical drive circuit on said at least one electrical circuit board for providing said first electrical signals.

13. The fiber-based display of claim 11 wherein said the first electrical signal is applied to the first electrodes at one of one end and both ends of each said transparent fiber.

14. The fiber-based display of claim 11 wherein said plurality of light-emitting elements comprises: a first electrode disposed along the surface of each of said plurality of fibers opposite the viewing surface of the fiber-based display, a layer of light-emitting material disposed on said first electrode; and a plurality of second electrodes of said plurality of light-emitting elements disposed on said layer of light-emitting material.

15. The fiber-based display of claim 11 wherein said source includes at least a second electrical circuit board having the plurality of second electrical conductors disposed thereon, and further comprising a plurality of electrical interconnections coupled between respective ones of the plurality of second electrical conductors and respective second electrodes of corresponding ones of the plurality of light-emitting elements.

16. The fiber-based display of claim 15 wherein said source includes at least one second electrical drive circuit on said at least second electrical circuit board for providing said second electrical signals.

17. The fiber-based display of claim 15 wherein said plurality of electrical interconnections are formed of an electrically-conductive adhesive.

18. The fiber-based display of claim 15 wherein said at least one of said at least one and said at least second electrical circuit boards is formed of one of a rigid circuit board material, a ceramic circuit board material, a ceramic circuit board material on a metal base, a flexible circuit board material, and a transparent circuit board material.

19. A display comprising:
an electrical circuit substrate having a plurality of data line conductors in a central region of a first surface thereof and having a plurality of select line conductors proximate at least one edge thereof;
a plurality of light-emitting transparent fibers disposed on the first surface of said electrical circuit substrate in side-by side relationship over at least the central region thereof, each said light-emitting transparent fiber comprising:
a transparent fiber disposed on said first surface to define a viewing surface of the display, and having first and second ends;
a plurality of light-emitting elements disposed along a surface of said transparent fiber proximate said electrical circuit substrate and opposite the viewing surface of the display, each said light-emitting element having first and second electrodes at which electrical select and data signals are respectively applied to cause said light-emitting elements to emit light;

means for connecting the first electrodes of said light-emitting fibers to said select line conductors and said second electrodes to said data line conductors;

a plurality of data line drive circuits responsive to data signals representative of information to be displayed for applying the data signals to said data line conductors; and a plurality of select line drive circuits responsive to select signals representative of information to be displayed for applying select signals to said select line conductors.

20. The display of claim 19 wherein said means for connecting includes an electrically-conductive adhesive connections.

21. The display of claim 19 wherein said electrical circuit substrate is formed of one of a rigid circuit board material, a ceramic circuit board material, a ceramic circuit board material on a metal base, and a flexible circuit board material, and a transparent circuit board material.

22. The display of claim 19 wherein said means for connecting connects said select line conductors to the first electrode at one or both of the first and second ends of said transparent fiber.

23. A display comprising:

a plurality of light-emitting transparent fibers disposed in side-by side relationship to define a viewing surface of the display, each said light-emitting transparent fiber comprising:

an elongated transparent fiber having first and second ends;

a plurality of light-emitting elements disposed along a surface of said transparent fiber, each said light-emitting element having first and second electrodes at which electrical select and data signals are respectively applied to cause said light-emitting elements to emit light;

a plurality of first electrical circuit boards each having a plurality of data line conductors thereon;

at least one second electrical circuit substrate having a plurality of select line conductors thereon;

means for connecting the first electrodes of said light-emitting transparent fibers to said select line conductors of said at least one second electrical circuit substrate, and for connecting the second electrodes of said light-emitting transparent fibers to said data line conductors of said plurality of first electrical circuit boards;

a plurality of data line drive circuits responsive to data signals representative of information to be displayed for applying the data signals to said data line conductors; and a plurality of select line drive circuits responsive to select signals representative of information to be displayed for applying select signals to said select line conductors.

24. The display of claim 23 wherein said means for connecting includes anisotropic electrically-conductive adhesive connections.

25. The display of claim 23 wherein said first and second electrical circuit substrates are each formed of one of a rigid circuit board material, a ceramic circuit board material, a ceramic circuit board material on a metal base, a flexible circuit board material, and a transparent circuit board material.

26. The display of claim 23 wherein said means for connecting connects said select line conductors to the first electrode at one or both of the first and second ends of said elongated transparent fiber.

* * * * *